United States Patent [19]
Owa et al.

[11] Patent Number: 5,902,716
[45] Date of Patent: May 11, 1999

[54] EXPOSURE METHOD AND APPARATUS

[75] Inventors: Soichi Owa, Tokyo; Kazuya Okamoto; Hiroshi Ooki, both of Yokohama; Masato Shibuya, Omiya, all of Japan

[73] Assignee: Nikon Corporation, Tokyo, Japan

[21] Appl. No.: 08/708,580

[22] Filed: Sep. 5, 1996

[30] Foreign Application Priority Data

| Sep. 5, 1995 | [JP] | Japan | 7-228399 |
| Aug. 1, 1996 | [JP] | Japan | 8-219486 |
| Aug. 30, 1996 | [JP] | Japan | 8-229597 |

[51] Int. Cl.$^6$ .................................................. G03F 7/20
[52] U.S. Cl. ........................... 430/312; 430/394; 430/396
[58] Field of Search .................................... 430/311, 312, 430/324, 325, 333, 396, 142, 141, 156, 157, 162, 292, 394

[56] References Cited

U.S. PATENT DOCUMENTS

| 4,677,049 | 6/1987 | Griffing et al. | 430/339 |
| 4,702,996 | 10/1987 | Griffing et al. | 430/325 |
| 5,108,874 | 4/1992 | Griffing et al. | 430/273 |
| 5,503,959 | 4/1996 | Langston | 430/394 |
| 5,547,813 | 8/1996 | Tsujita | 430/325 |

FOREIGN PATENT DOCUMENTS

| 59-104642 | 6/1984 | Japan . |
| 401273030A | 10/1989 | Japan . |
| 6-291009 | 10/1994 | Japan . |

OTHER PUBLICATIONS

Resist Material and Process Technology, "High Sensitive and High Resolution Technology, CEL Method", Naplics Corp., ISBN 4-906317-19-7, Publ. May, 1991.

Nakase et al, "Evaluation of Contrast–Enhancing Layer Using the ABC Model", Toshiba VLSI Research Ctr. Research and Dev. Ctr., ICICE Technical research report vol. 84, No. 241, published Dec. 18, 1984.

B F Griffing, et al, "Contrast Enhanced Photolithography", IEEE Electron Device Letters, vol. EDL–4, No. 1, Jan. 1983, pp. 14–16.

Dill, et al, "Characterization of Positive Photoresist", IEEE Translation on Electron Devices, vol. ED–22, No. 7, Jul. 1975, pp. 446–452.

Process Technology, Resist Materials, Publ. May 27, 1991, pp. 70–83.

Nakase, et al., "Contrast–enhancing Layer (CEL Evaluation of Contrast–enhancing Layer Using the ABC Model", Toshiba VLSI Research Center R&D Center, pp. 1–8.

Primary Examiner—Kathleen Duda
Attorney, Agent, or Firm—Foley & Lardner

[57] ABSTRACT

After a photoresist is applied onto a wafer, a contrast enhancement material (CEM) layer is applied onto this photoresist. A pattern is projected through this CEM layer onto the photoresist. Next, this CEM layer is removed from the photoresist and thereafter a new CEM layer is again applied onto the photoresist. Another pattern is projected through this new CEM layer onto the photoresist, whereby the photoresist is exposed in accordance with a composite pattern of the two patterns. This composite pattern can surpass the resolution limit of projection optical system.

8 Claims, 18 Drawing Sheets

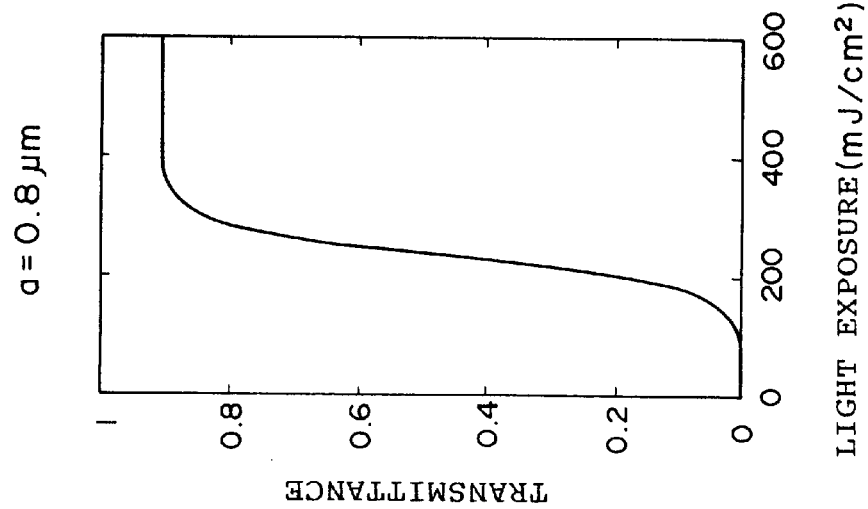
Fig.5D  a = 0.8 μm
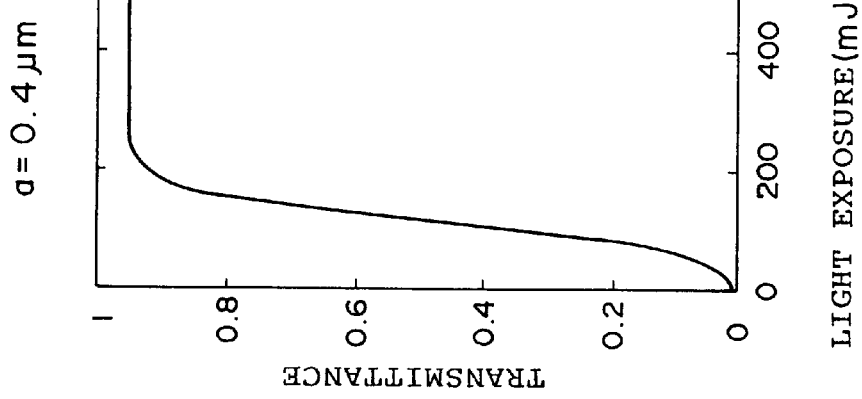
Fig.5C  a = 0.4 μm
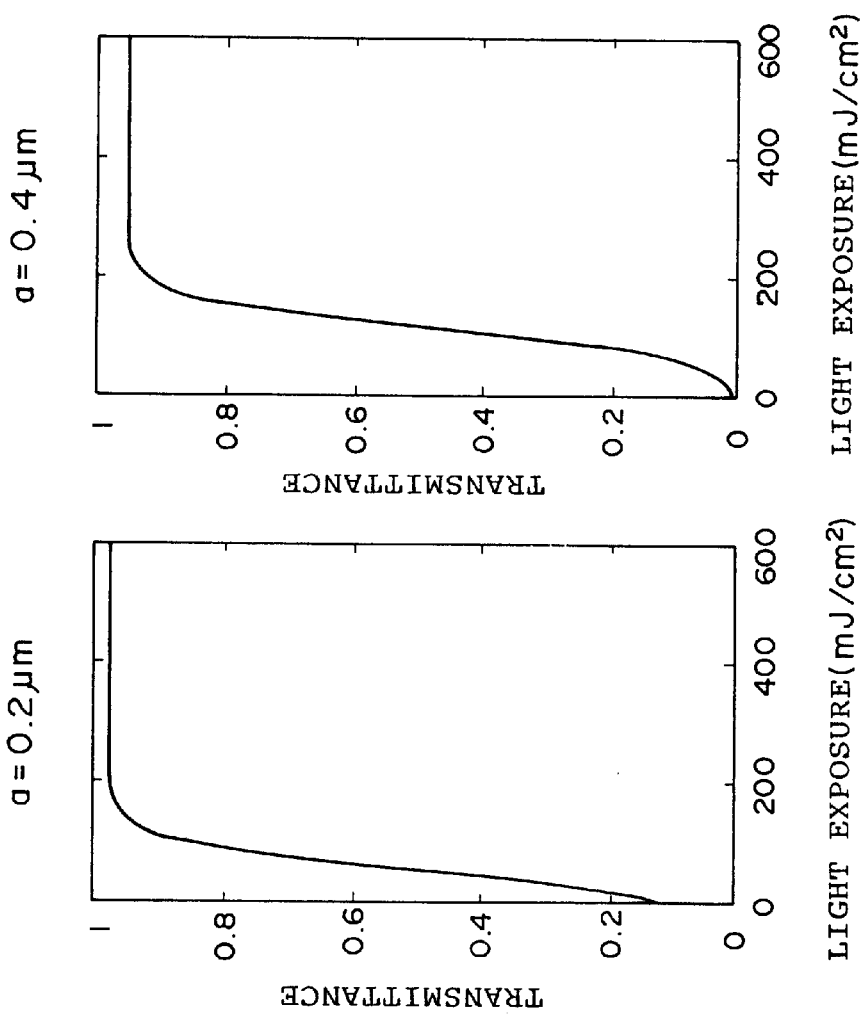
Fig.5B  a = 0.2 μm

EXPOSURE METHOD AND APPARATUS

BACKGROUND OF THE INVENTION

1. Field of the Invention

The present invention relates to an exposure method and exposure apparatus used in forming fine patterns of semiconductor devices or liquid crystal displays.

2. Related Background Art

With progress of semiconductor fabrication techniques, integration rates of semiconductor integrated circuits have been improved heretofore. The resolution of projection exposure needs to be enhanced in order to improve the integration rates. The resolution depends upon the wavelength of exposure light and the numerical aperture of projection optical system. Namely, the resolution increases with decreasing wavelength (λ) of exposure light or with increasing numerical aperture (NA).

The wavelength of exposure light used in recent projection exposure apparatus comes to be as short as that of the excimer laser, and the numerical aperture is approximately 0.5.

SUMMARY OF THE INVENTION

In the exposure method of the present invention, after a photoresist is applied onto an object, a layer of contrast enhancement material (CEM) is applied onto the photoresist. This CEM layer changes its transmittance, depending upon a quantity of light projected onto the CEM layer. When a pattern is projected through the CEM layer onto the photoresist, the photoresist is exposed in accordance with the pattern. After this CEM layer is removed from the photoresist, a new CEM layer is again applied onto the photoresist. When another pattern is projected through this new CEM layer onto the photoresist, the photoresist is exposed in accordance with a composite pattern of the two patterns. The resolution of this composite pattern can be over the limit determined by the numerical aperture of projection optical system and the wavelength of exposure light.

BRIEF DESCRIPTION OF THE DRAWINGS

FIGS. 5A to 5D are graphs to show the relationship between light exposure and transmittance;

DESCRIPTION OF THE PREFERRED EMBODIMENTS

A method for forming a pattern in resolution over the resolution limit of projection optical system on the photoresist will be described with an embodiment.

Figure 1:
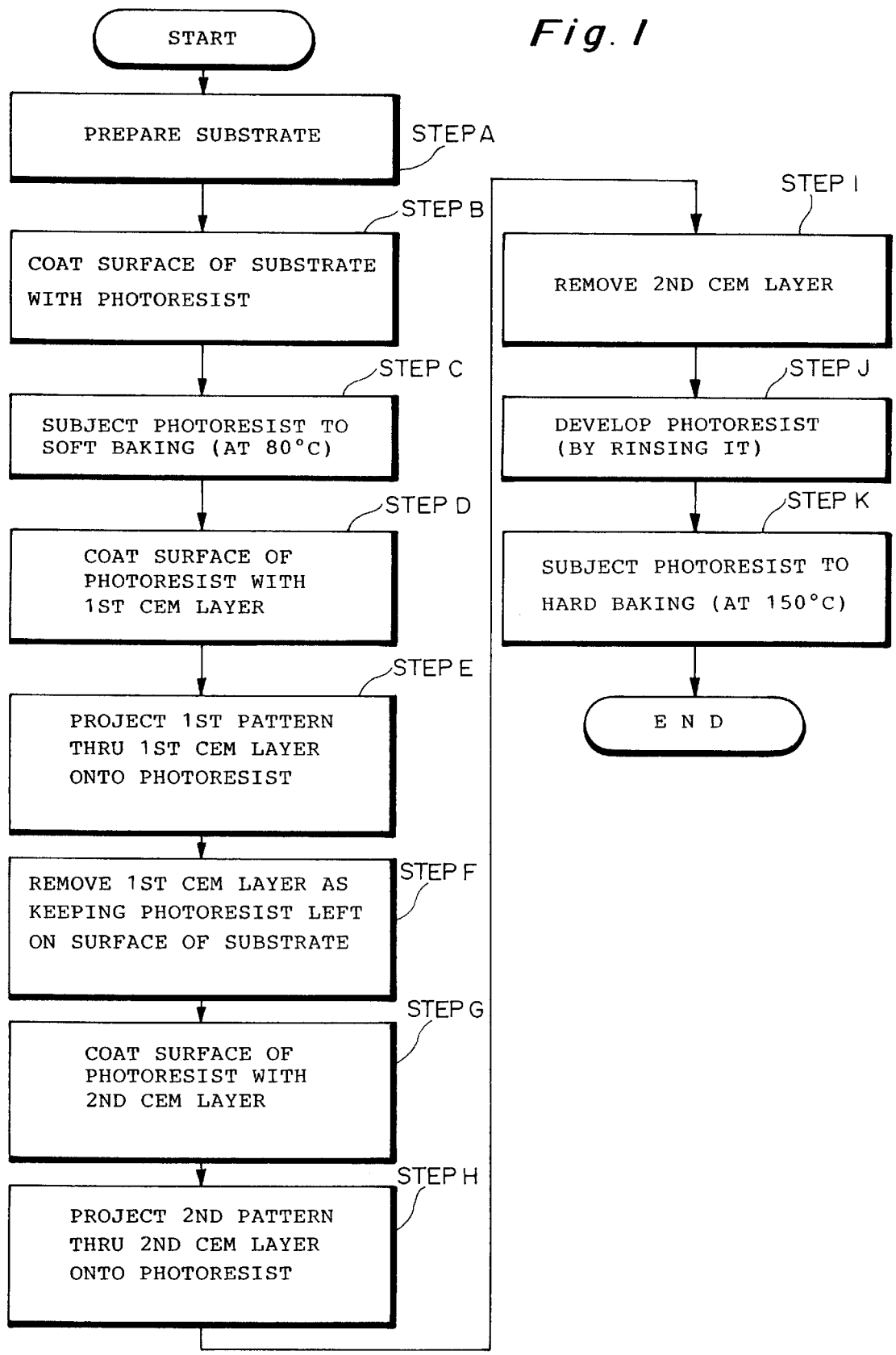
FIG. 1 is a flowchart for explaining a method according to an embodiment.

FIG. 1 is a flowchart for explaining a pattern forming method using the exposure method according to the embodiment. FIG. 2A to FIG. 2K are drawings for explaining this method. The following description will make reference to FIG. 2A to FIG. 2K as occasion demands. An article comprising a substrate 1 shown in FIG. 2A to FIG. 2K will be referred to as an object 20.

Figure 2A:
FIGS. 2A to 2K are explanatory drawings for explaining the method according to the embodiment of FIG. 1.

In this method, the substrate 1 is first prepared at step A (FIG. 2A). The substrate 1 is made of a material containing Si. When Si is used as a material for the substrate 1, semiconductor devices, for example, dynamic random access memory (DRAM), static random access memory (SRAM), and central processing unit (CPU), can be fabricated. Since the semiconductor devices have multilayer wire structure, the substrate 1 is defined as encompassing those having wires made of a material of Al, W, or a silicide thereof, or an insulating layer of silicon dioxide or the like, formed on the surface of Si substrate.

The substrate 1 may be one made of a material containing a compound semiconductor such as GaAs. The compound semiconductors with higher electron mobility than that of Si, such as GaAs, are used for high-frequency devices including radio communication devices.

The substrate 1 may be made of a material containing glass. Glass is used for displays using thin film transistors (TFT) and liquid crystal.

Figure 2B:
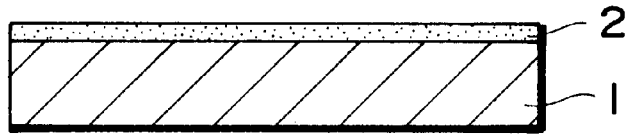

Next, at step B, the surface of the substrate 1 is coated with a photoresist layer 2 (FIG. 2B). Describing in more detail, a photoresist material is dropped from a nozzle not shown onto the substrate 1 and thereafter the substrate 1 is rotated by a spinner so as to form a uniform coating of the photoresist material on the substrate 1, thus forming the photoresist layer 2 on the substrate 1.

The photoresist is a material which, when being subject to light irradiation through a mask, absorbs light energy to cause a photochemical reaction and to form a latent image inside. The present method adopts a negative photoresist, but a positive photoresist may be used instead thereof. Further, the photoresist may be a novolak-based photoresist for the i-line having linear sensitivity characteristics against light exposure.

The negative photoresist is one containing a mixture of a cyclized rubber based resin and a bisdiazide based compound in an organic solvent. The bisdiazide based compound is a photosensitive crosslinking agent. Namely, when a predetermined area of this photoresist is irradiated by light, a crosslinking reaction takes place between the bis-diazide based compound and the cyclized rubber based resin so as to harden the photoresist in this area. Since non-irradiated areas of the photoresist are not hardened, the irradiated area and the non-irradiated areas have different solubilities to a liquid developer. Therefore, a latent image pattern is formed in the photoresist when a pattern is projected to the photoresist.

The positive photoresist is a mixture containing a quinone diazide based photosensitive agent, an alkali-soluble phenol based resin, and an organic solvent. This mixture is not soluble in alkali, but it becomes soluble in alkali after irradiation of light. The quinone diazide based photosensitive agent employed is, for example, 2-diazo-1 naphthol-5-sulfonate.

Figure 2C:
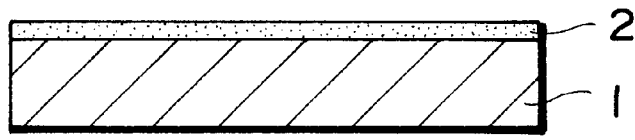

Next, at step C, the photoresist layer 2 is subjected to soft baking (FIG. 2C). The temperature of this baking is about 80° C. This baking hardens the photoresist layer 2 so as not to deform it.

Figure 2D:
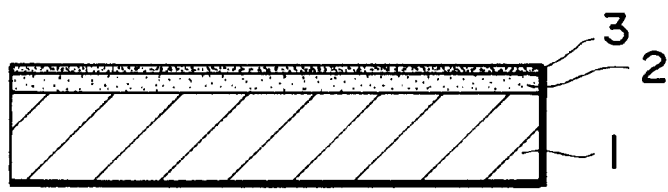

Next, at step D, the surface of the photoresist layer 2 is coated with a first contrast enhancement material (CEM) layer 3 (FIG. 2D). This contrast enhancement material layer is also called CEL. For coating the surface of the photoresist layer 2 with the CEM layer 3, the CEM is dropped from a nozzle not shown onto the photoresist layer 2 and thereafter the substrate 1 is rotated by a spinner so as to form a uniform coating of CEM on the substrate 1. Therefore, the CEM layer 3 is formed on the photoresist layer 2. In the case where the CEM layer 3 is made of a material comprising nitrone, a water-soluble binder resin layer (not shown) is first formed on the photoresist layer 2 and thereafter the CEM layer 3 is formed on this binder resin layer. If the CEM layer 3 itself is made of a water-soluble material, this binder resin layer is not always necessary.

The CEM is a material increasing its transmittance with increasing quantity of light projected thereto. Describing in more detail, the CEM has such characteristics that the transmittance of light is low before incidence of light, but the transmittance of light increases with increasing quantity of light incident thereto, and the transmittance of almost 100% is achieved with certain quantity of light. The CEM is a substance containing a photofading compound.

The photofading compound used is selected, for example, from nitrone, polysilane, diazonium salts, and styrylpyridinium salts.

Nitrone is described in Japanese Laid-open Patent Application No. 59-104642 (U.S. Pat. Nos. 4,677,049, 4,702,996, and 5,108,874), and the description in these United States Patents is incorporated herein as to nitrone.

The CEM containing nitrone, commercially available, is CEM 388WS (trademark of Shin-Etsu Chemical Co. Ltd.). Water permeates the CEM containing nitrone, but it is not soluble in water. Therefore, when this CEM is applied onto the photoresist, the water-soluble binder resin is applied between the CEM layer and the photoresist layer, as described above.

The binder resin employed is, for example, pullulan or polyvinyl pyrrolidone.

The CEM (CEL) is described in Process technology, resist materials (1991, published by Association for Technical information), Characteristic evaluation of CEL by ABC model (Technical research report Vol. 84, No. 241, SDD 94–97, The Institute of Electronics, Information and Communication Engineers (ICICE)), and B. F. Griffing and P. R. West, IEEE Electron Devices Letters, Vol. EDL-4, No. 1, JANUARY 1983, P14–16.

The CEM is characterized by the following two differential equations.

$$\partial I(a,t)/\partial a = -I(a,t)\{AM(a,t)+B\}$$

$$\partial M(a,t)/\partial t = -I(a,t)M(a,t)C$$

Here, A, B, and C are parameters characterizing the CEM, I(a, t) is light intensity at (a, t), and M is a relative concentration of CEM dye (M(0, 0)=1).

The parameters A, B, and C for CEM can be obtained empirically by the following three equations.

$$A=(1/a)ln(T_\infty/T_0) \quad \text{(Eq. 1)}$$

$$B=-(1/a)lnT_\infty \quad \text{(Eq. 2)}$$

$$C=[(A+B)/\{AI(x)T_0(1-T_0)\}]\cdot[dT(t)/dt](\text{at } t=0) \quad \text{(Eq. 3)}$$

Here, a is a film thickness of the CEM layer 3, $T_\infty$ a transmittance of the CEM layer after the color of CEM layer 3 has perfectly faded away, $T_0$ a transmittance of the CEM layer 3 before exposure thereof, I(x) intensity of exposure light, t an exposure time, and T(t) a transmittance of the CEM layer at time t.

The details of the equations using these parameters are described in F. H. Dill, W. P. Hornberger, P. S. Hauge, J. M. Shaw, IEEE Transactions Electron Devices, Vol. ED-22, No. 7, July 1975, p445–452.

The CEM layer 3 used in the present embodiment has the characteristics specified by A=11.1/$\mu$m, B=0.192/$\mu$m, C=0.033 cm$^2$/mJ, and a=0.5 $\mu$m.

Figure 2E:
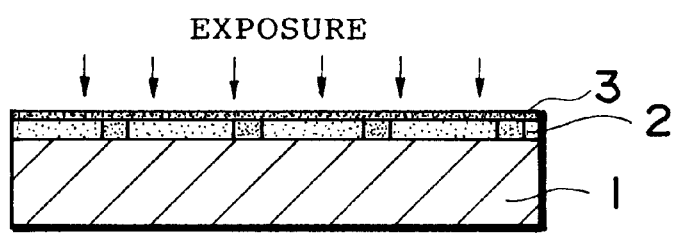
Figure 3A:
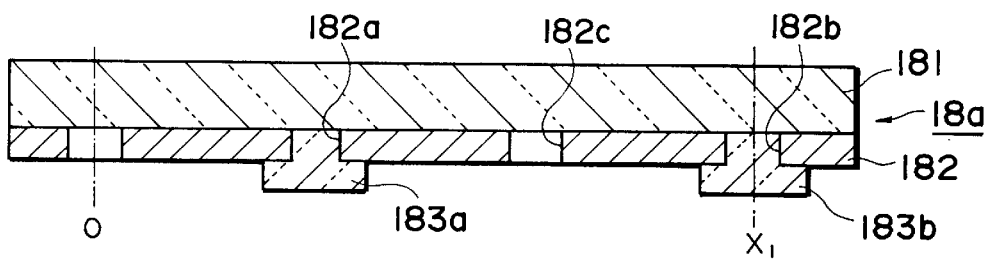
FIG. 3A is a sectional view of a phase shift mask.

Next, at step E, the exposure light is projected through a photomask (reticle) 18a shown in FIG. 3A onto the first CEM layer 3. Accordingly, a pattern (a first pattern) of the photomask 18a is projected through the first CEM layer 3 onto the photoresist layer 2 (FIG. 2E). The present embodiment employs a phase shift mask as the photomask 18a.

FIG. 3A shows the phase shift mask 18a used in the present method. The phase shift mask 18a is comprised of a glass substrate 181, and a shielding film 182 and phase shifters 183a, 183b formed on the glass substrate 181. The shielding film 182 is made of Cr and has aperture portions 182a, 182b, 182c corresponding to exposure areas. The shifters 183a and 183b are provided in the aperture portions 182a, 182b, respectively, next to the aperture portion 182c, so that a phase of the exposure light emerging from the aperture portion 182c is shifted 180° relative to a phase of the exposure light emerging from the shifters 183a and 183b. Since the phases are reverse between the diffracted light from the aperture portion 182c and the diffracted light from the aperture portions 182a and 182b, they cancel each other, thus separating images of the aperture portions 182a, 182b, 182c from each other.

Let us define a direction of the X-axis as a direction along the surface of the substrate 1. A position along the X-axis direction is represented by x. The longitudinal direction of the photomask 18a shown in FIG. 3A is parallel to the X-axis direction, and the region between 0 and $X_1$ in the same drawing is projected onto the CEM layer 3.

In the case where the pattern on the photomask 18a has straight line areas placed regularly (or in the case of a line-and-space pattern comprising at least two line patterns and spaces between them), the intensity I(x) at position x of the first pattern projected onto the first CEM layer 3 is expressed by the following equation.

$$I(x)=I_0 \cos(2\pi x/P)+I_1 \tag{Eq. 4}$$

Here, $I_0$ is a constant, $\pi$ the circle ratio, $I_1$ a constant, and P the period of pattern of the resolution limit. Further, $P=\lambda/2NA$, where $\lambda$ is the wavelength of exposure light and NA is the numerical aperture of projection optical system 19 (see FIG. 10). The first pattern is a pattern of the resolution limit, and an intensity distribution function I(x) has a maximal value (peak) at positions of $x=n \times P$. Here, n is integers. In the present embodiment, the wavelength of the exposure light is $\lambda=365$ nm, the numerical aperture of projection optical system 19 is NA=0.6, and thus, P=304 nm. Further, $I_0=I_1=50$ mW/cm².

Therefore, light exposure E(x) at position x of the CEM layer 3 is expressed by the following equation.

$$E(x)=I(x) \cdot t \tag{Eq. 5}$$

Here, t is the time. Further, t=3 seconds in the present embodiment.

Figure 3B:
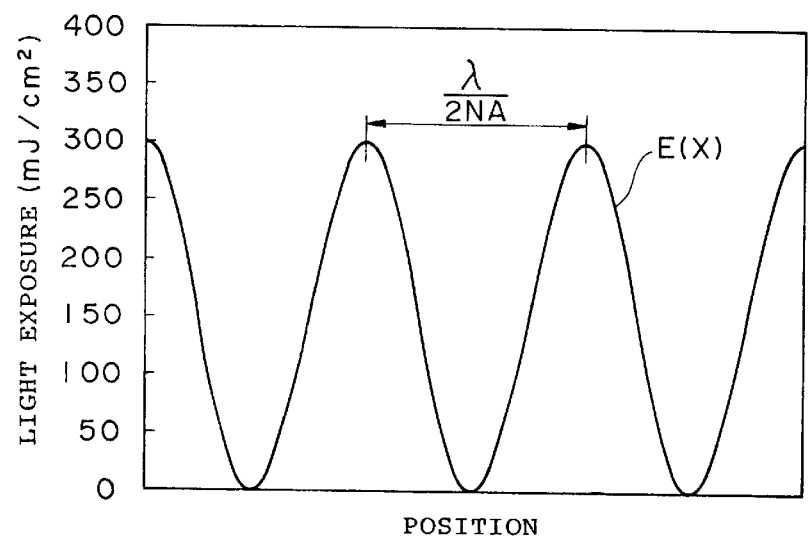
FIG. 3B is a graph to show the relationship between position and light exposure.

FIG. 3B is a graph to show the relationship between light exposure E(x) (mJ/cm²) and position x. The period P of the pattern, i.e., the distance between maximal values (peaks) of the light exposure E(x), is $\lambda/2NA$ because of use of the phase shift mask.

Figure 5A:
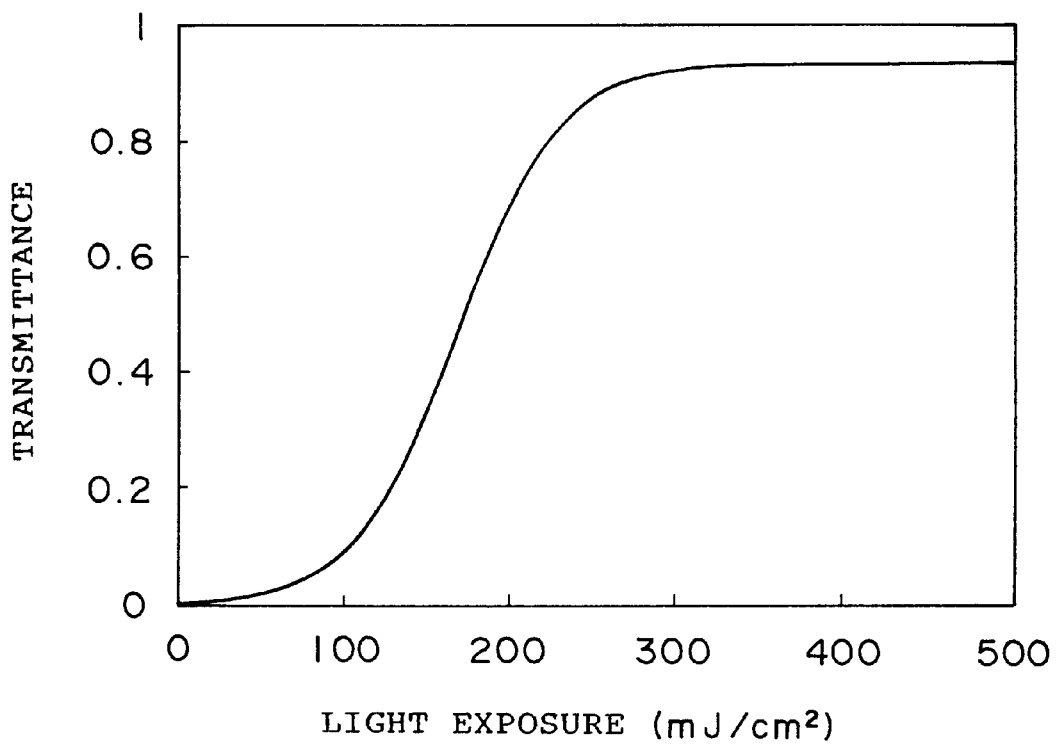

FIG. 5A is a graph to show the relationship between light exposure E and transmittance T. This graph was obtained by simulation. The characteristic curve shown in FIG. 5A starts rising from near the light exposure E of 100 mJ/cm² and saturates to a constant value near the light exposure E of 300 mJ/cm².

The relationship of transmittance T and light exposure E between the start of rise and the saturation of the characteristic curve shown in FIG. 5A can be approximated by the following equation.

$$T=K \cdot (E-E_0)+T_0 \tag{Eq. 6}$$

Here, $E_0<E$.

The transmittance T before the start of rise of the characteristic curve shown in FIG. 5A can be approximated by the following equation.

$$T=T_0 \tag{Eq. 7}$$

Here, $E \leq E_0$.

Here, K is a proportional constant, and $T_0$ is the transmittance of the CEM layer 3 when the CEM layer 3 is not irradiated by the exposure light. Further, $E_0$ is given approximately by $E_0=a$ A/C. When the thickness a takes some large value as in the present embodiment, it can be assumed that $T_0=0$. Here, $E_0$ is a positive value. Namely, the derivative of second order of the characteristic curve shown in FIG. 5A takes positive values near the light exposure E of 100 mJ/cm². In other words, the relationship of transmittance T versus light exposure E has a nonlinear region where the derivative of second order takes positive values, in the region before saturation of this characteristic curve. The contrast of a transmission exposure pattern using the CEM layer 3 having such nonlinear relation is higher than that of a pattern having linear relation. With higher contrast of transmission exposure pattern, the contrast of a latent image pattern finally formed in the photoresist layer 2 can be enhanced.

Described below is the thickness a of the CEM layer 3 with the relation of transmittance T versus light exposure E being nonlinear as described above. With changing the thickness a of the CEM layer 3, the relation of transmittance T versus light exposure E was investigated.

Each of FIGS. 5B to 5C is a graph to show the relationship between light exposure E and transmittance T when the exposure light is projected to the CEM layer of the thickness a=0.2 μm, a=0.4 μm, or a=0.8 μm, respectively. Characteristics of the CEM layers of these graphs are expressed by parameters A=11.1/μm, B=0.129/μm, and C=0.0394 cm²/mJ. From these graphs, the thickness a of the CEM layer 3 is preferably not less than 0.4 μm in order to make the relation of transmittance T versus light exposure E nonlinear as described above. Namely, the contrast of transmission exposure pattern can be improved if the thickness a of the CEM layer 3 is 0.4 or more μm.

The transmittance T(x) at position x of the CEM layer 3 changes depending upon the light exposure E(x) projected thereto.

From Eq. 6, the relationship of transmittance T and light exposure E between the start of rise and the saturation of the characteristic curve of FIG. 5A can be approximated by the following equation.

$$T(x)=K \cdot (E(x)-E_0)+T_0 \tag{Eq. 8}$$

Here, $E_0<E$.

Further, from Eq. 7, the transmittance T before the start of rise of the characteristic curve of FIG. 5A can be approximated by the following equation.

$$T(x)=T_0 \tag{Eq. 9}$$

Here, $E \leq E_0$.

The light intensity i(x) at position x of a pattern transmitted by the CEM layer 3 and projected onto the photoresist layer 2 is given by the following equation.

$$i(x)=T(x) \cdot I(x) \tag{Eq. 10}$$

The light exposure (quantity of transmitted light) D(x) (mJ/cm²) projected onto the photoresist layer 2 is an integral of the intensity i of the light transmitted by the CEM layer 3 with respect to the time, which is given by the following equation.

$$D=\int i \, dt \tag{Eq. 11}$$

Figure 6:
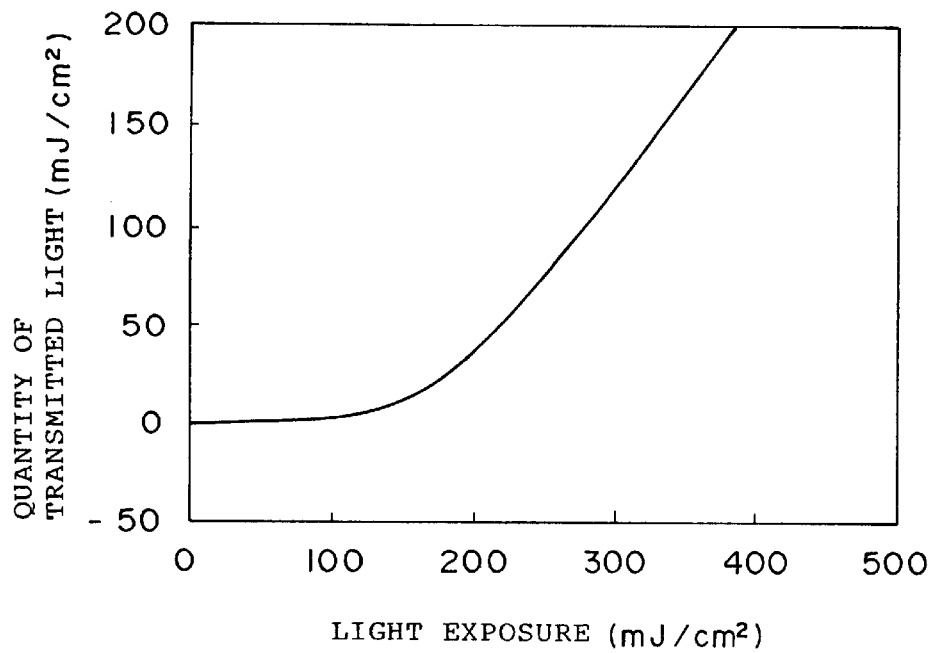
FIG. 6 is a graph to show the relationship between light exposure and quantity of transmitted light.

The relationship between light exposure E (mJ/cm²) and quantity of transmitted light D (mJ/cm²) is shown in FIG. 6.

When exposure is carried out in the linear region represented by Eq. 8, of the characteristic curve shown in FIG. 5A, the light exposure (quantity of transmitted light) D(x) at position x of the first pattern projected onto the photoresist layer 2 is given by the following equation.

$$D(x) = \int i(x) \, dt \tag{Eq. 12}$$
$$= \alpha I(x)^2 + \beta I(x)$$

Here, $\alpha=Kt^2/2$, $\beta=(T_0-KE_0)t$, and $E_0<E$.

When exposure is carried out in the region represented by Eq. 9, of the characteristic curve shown in FIG. 5A, the light exposure (quantity of transmitted light) D(x) at position x of the first pattern projected onto the photoresist layer 2 is given by the following equation.

$$D(x) = \int i(x)dt \qquad \text{(Eq. 13)}$$
$$= T_0 t I(x)$$

Here, $E \leq E_0$.

Figure 3C:
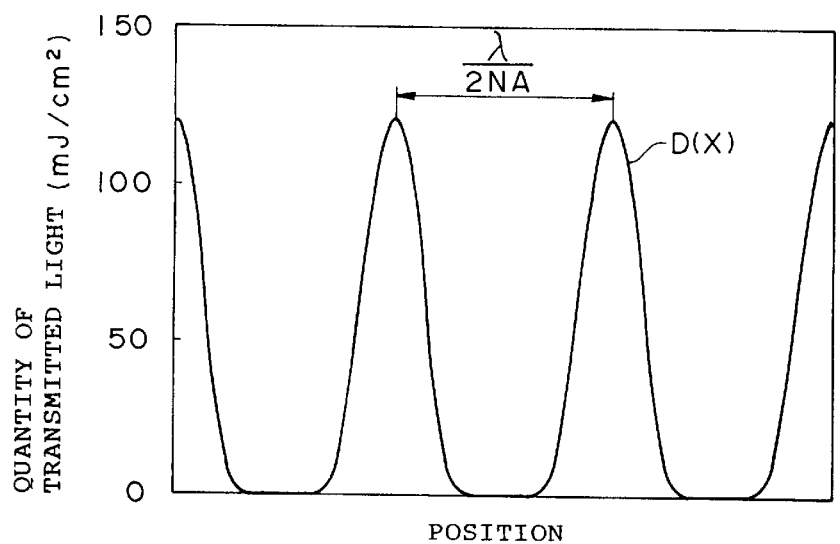
FIG. 3C is a graph to show the relationship between position and quantity of transmitted light.

This means that when the light exposure E at position x of the first pattern projected onto the CEM layer 3 is greater than the threshold exposure light $E_0$, the quantity of transmitted light D is emphasized by the second power of light intensity I; when the light exposure E at position x of the first pattern is not more than the threshold light exposure $E_0$, the quantity of transmitted light D is proportional to the light intensity I. Therefore, the contrast of the first pattern projected is emphasized. Further, since $T_0=0$ in the characteristic curve shown in FIG. 5A, the quantity of transmitted light of the first pattern at position x where the light exposure E is not more than the threshold light exposure $E_0$ is zero, and the contrast of the first pattern is thus further emphasized. The relationship between position x and quantity of transmitted light D (mJ/cm²) by the present embodiment is shown in FIG. 3C.

Figure 2F:
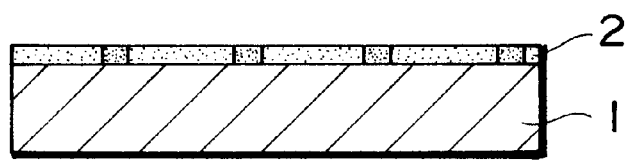

Next, at step F, the first CEM layer 3 is removed as keeping the photoresist layer 2 left on the surface of the substrate 1 (FIG. 2F). In the case where the photoresist layer 2 is of a negative photoresist material, this photoresist layer 2 is soluble in an organic solvent such as trichloroethylene, but not soluble in water. On the other hand, the CEM layer 3 is made of a water-soluble material or a material capable of being peeled off with water. Therefore, when the substrate 1 with the photoresist layer 2 and CEM layer 3 formed thereon is immersed in pure water, only the CEM layer 3 can be selectively removed from the substrate 1. Any method can be applied other than the method of immersing the substrate 1 in pure water if it can remove the CEM layer 3. For example, the CEM layer 3 may be removed from the photoresist layer 2 by exposing the CEM layer 3 to shower of pure water.

Figure 2G:
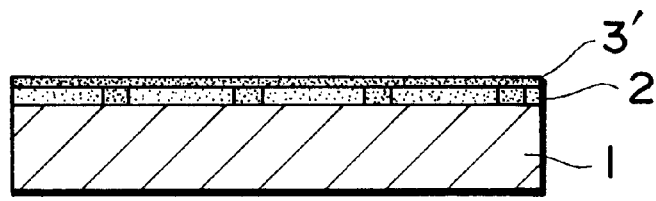

Next, at step G, the surface of the photoresist layer 2 is coated again with a CEM layer 3' (FIG. 2G). Namely, the CEM is dropped from a nozzle not shown onto the photoresist layer 2 and thereafter the substrate 1 is rotated by a spinner so as to form a uniform coating of CEM on the substrate 1, thus forming the second CEM layer 3' on the photoresist layer 2.

Figure 2H:
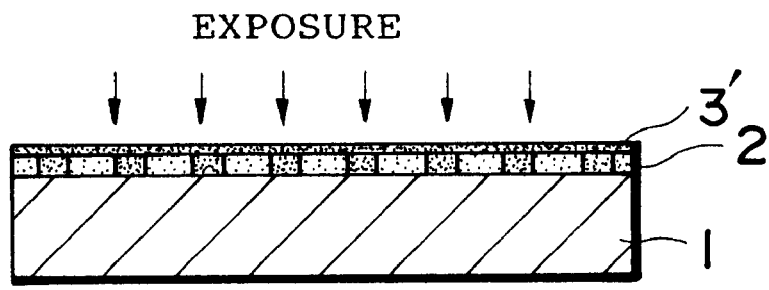
Figure 4A:
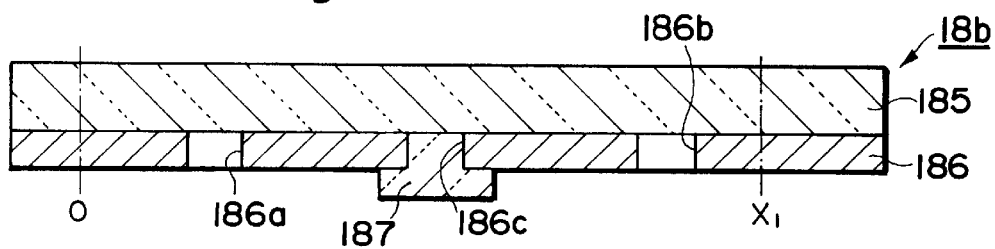
FIG. 4A is a sectional view of a phase shift mask.

Next, at step H, the exposure light is projected through a photomask (reticle) 18b (FIG. 4A) onto the second CEM layer 3'. Therefore, a pattern (second pattern) of the photomask 18b is projected through the second CEM layer 3' onto the photoresist layer 2 (FIG. 2H).

If the pattern on the photomask 18b has straight line areas placed regularly (a line-and-space pattern comprising at least two line patterns and spaces located between them), the intensity distribution I'(x) of the second pattern of the resolution limit projected onto the second CEM layer 3' is expressed by the following equation. The intensity I'(x) is shifted the half period from the intensity I(x).

$$I'(x) = -I_0 \cos(2\pi x/P) + I_1 \qquad \text{(Eq. 14)}$$

Here, $I_0 = I_1 = 50$ mW/cm².

Here, P=λ2NA. The present embodiment uses a phase shift mask as the photomask 18b. The phase shift mask 18b is comprised of a glass substrate 185, and a shielding film 186 and a phase shifter 187 formed on the glass substrate 185. The shielding film 186 is made of Cr and has aperture portions 186a, 186b, 186c corresponding to the exposure areas. The shifter 187 is provided in the aperture portion 186c located between the aperture portions 186a and 186b, so that a phase of the exposure light emerging from the aperture portions 186a and 186b is shifted 180° relative to a phase of the exposure light emerging from the shifter 187. Therefore, the phases are reverse between the diffracted light from the aperture portion 186c and the diffracted light from the aperture portions 186a and 186b, and thus, they cancel each other. Therefore, images of the respective aperture portions 186a, 186b, 186c are separated from each other. In the present embodiment, the region of from the position 0 to $X_1$ of the photomask 18b is assumed to be projected onto the CEM layer 3'.

Figure 4B:
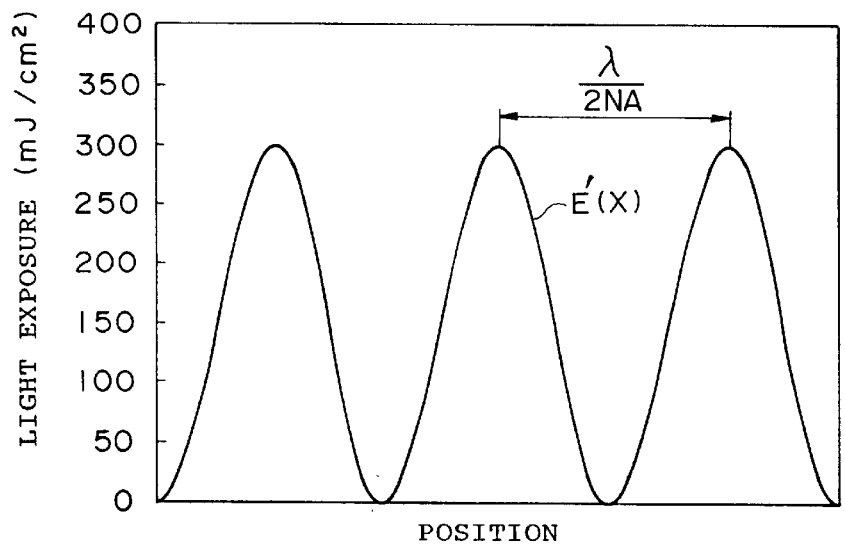
FIG. 4B is a graph to show the relationship between position and light exposure.
Figure 4C:
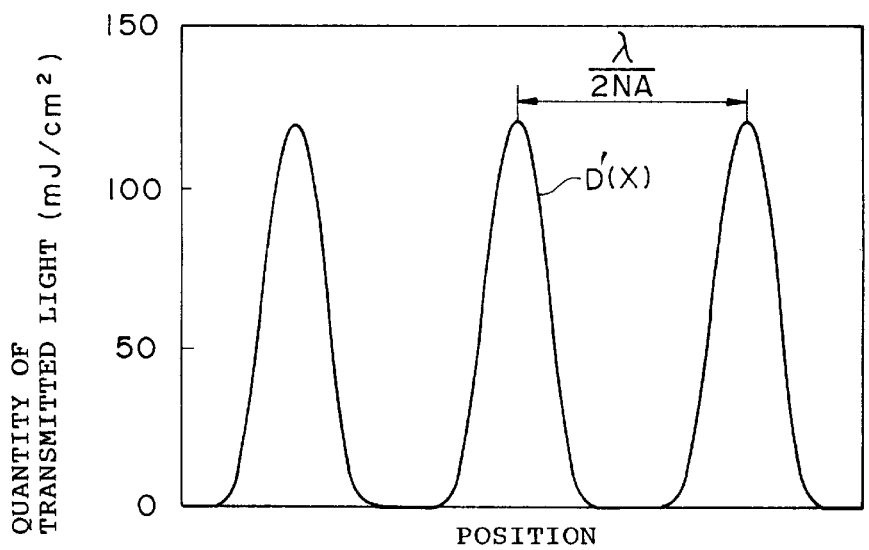
FIG. 4C is a graph to show the relationship between position and quantity of transmitted light.

The relationship between position x and light exposure E'(x) (mJ/cm²) of the second pattern projected onto the second CEM layer 3' is shown in FIG. 4B, and the relationship between position x and quantity of transmitted light D'(x) of the second pattern transmitted by the second CEM layer 3' is shown in FIG. 4C.

Therefore, if exposure is carried out in the linear region represented by Eq. 8, of the characteristic curve shown in FIG. 5A, the light exposure (quantity of transmitted light) D'(x) at position x of the second pattern projected onto the photoresist layer 2 is given by the following equation. The exposure period is t=3 seconds.

$$D'(x) = \int i(x)dt \qquad \text{(Eq. 15)}$$
$$= \alpha I'(x)^2 + \beta I'(x)$$

Here, $\alpha = Kt^2/2$, $\beta = (T_0 - KE_0)t$, and $E_0 < E$.

If exposure is carried out in the region represented by Eq. 9, of the characteristic curve shown in FIG. 5A, the light exposure (quantity of transmitted light) D'(x) at position x of the second pattern projected onto the photoresist layer 2 is given by the following equation.

$$D'(x) = \int i(x)dt \qquad \text{(Eq. 16)}$$
$$= T_0 t I'(x)$$

Here, $E \leq E_0$.

A latent image density distribution is already formed in the photoresist layer 2 by the light exposure D(x) with the first pattern. Supposing latent image densities in the photoresist layer 2 are proportional to light exposure, densities of the latent image C(x) at position x formed in the photoresist layer 2 by the first pattern are γ·D(x), and densities of the latent image C'(x) formed in the photoresist layer 2 by the second pattern are γ·D'(x). Here, γ is a proportional constant.

Accordingly, a density distribution function of latent image $C_{TOTAL}(x)$ formed in the photoresist layer 2 after exposure of the first and second patterns is given by the following equation if light exposures E at all positions x satisfy Eq. 8 ($E_0 < E$).

$$\begin{aligned} C_{TOTAL}(x) &= C(x) + C'(x) & \text{(Eq. 17)} \\ &= \gamma\alpha(I(x)^2 + I'(x)^2) + \gamma\beta(I(x) + I'(x)) \\ &= \gamma\alpha(I(x)^2 + I'(x)^2) + 2\gamma\beta I_1 \\ &= 2\gamma\alpha(I_0^2 \cdot \cos^2(2\pi x/P) + I_1^2) + 2\gamma\beta I_1 \end{aligned}$$

Figure 4D:
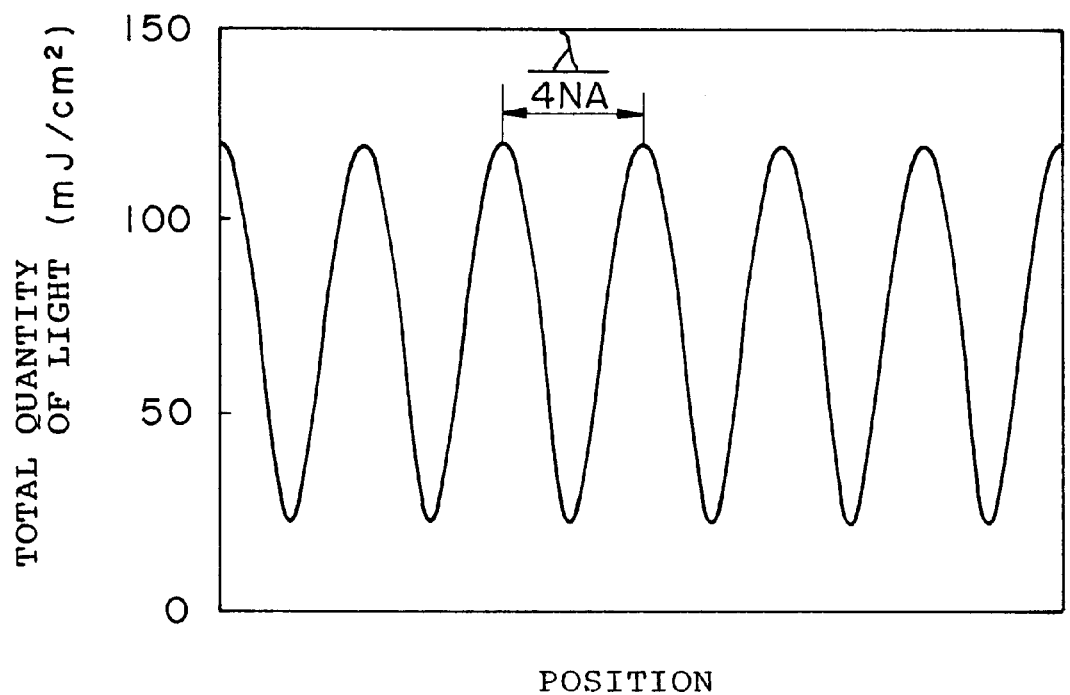
FIG. 4D is a graph to show the relationship between position and total light exposure.

The latent image density distribution function $C_{TOTAL}(x)$ in Eq. 17 takes maximal values at $x = n \times (P/2) = n \times P'$. Here, $P' = P/2 = \lambda/4NA$, and n is integers. Namely, since the period of the first and second patterns projected onto the CEM layers 3 and 3', respectively, is P, the period P' of the latent image pattern formed on the photoresist 2 by the present method is a half of the period P. Although each of the patterns of the resolution limit was projected onto the CEM layer 3 and 3', the latent image pattern finally formed in the photoresist layer 2 can surpass the resolution limit. The relationship between position x and light exposure (quantity of transmitted light) (mJ/cm$^2$) of the pattern brought into the photoresist layer 2 is shown in FIG. 4D. This light exposure distribution is proportional to the latent image density distribution and the contrast of this latent image density pattern is 0.68.

With the density distribution function $C_{TOTAL}(x)$ of the latent image formed in the photoresist layer after exposure of the first and second patterns, when areas satisfying $E \leq E_0$ in the first and second patterns overlap with each other, the latent image density of this overlapping region is given by the following equation.

$$\begin{aligned} C_{TOTAL} &= C(x) + C'(x) \\ &= \gamma T_0 t (I(x) + I'(x)) \\ &= 2\gamma T_0 t I_1 \end{aligned} \quad \text{(Eq. 18)}$$

Namely, at a middle point between a position giving a maximal value of the light intensity of the first pattern and a position giving a maximal value of light intensity of the second pattern, if the light exposure E of each of the first and second patterns is lower than the threshold light exposure $E_0$ the latent image density in the photoresist layer 2 at this position is $2\gamma T_0 t I_1$. Especially, if $T_0$ is 0, the latent image density at this position is 0, and thus, latent image density peaks of the first and second patterns can be remarkably separated from each other.

Figure 2I:
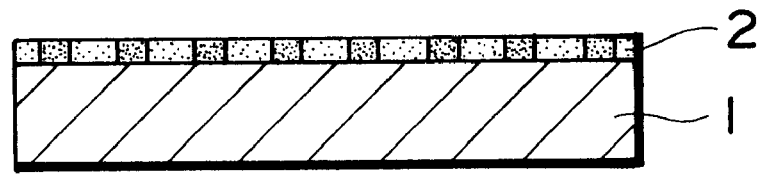

Next, at step 1, the second CEM layer 3' is removed as keeping the photoresist layer 2 left on the surface of the substrate 1 (FIG. 2I). The CEM layer 3' is also made of a water-soluble material. Therefore, when the substrate 1 with the photoresist layer 2 and CEM layer 3' formed thereon is immersed in pure water, only the CEM layer 3' can be selectively removed from the substrate 1. If the CEM layer 3' is made of a material such as nitrone, a water-soluble binder resin layer is interposed between it and the resist layer 2. Thus, when the substrate 1 is immersed in pure water, the binder resin layer dissolves into water, and only the CEM layer 3' can be selectively removed from the substrate 1. Any method other than the method of immersing the substrate 1 in pure water may be employed if it can remove the CEM layer 3'. For example, the CEM layer 3' may be removed from the photoresist layer 2 by exposing the CEM layer 3' to shower of pure water.

Figure 2J:
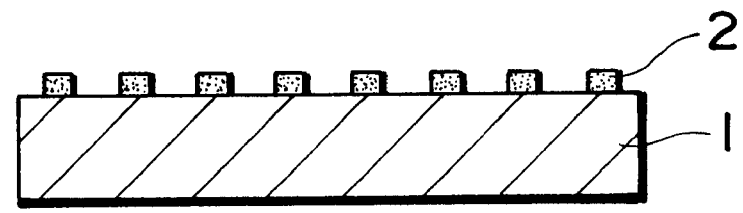

Next, at step J, the photoresist layer 2 is developed (or rinsed) (FIG. 2J). Namely, non-hardened areas in the photoresist layer 2 are removed with an organic solvent. This exposes the latent image pattern in the photoresist layer 2.

Figure 2K:
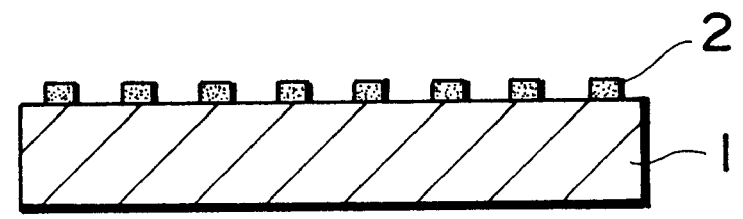

Next, at step K, the photoresist layer 2 is subjected to hard baking (FIG. 2K). The temperature of this baking is approximately 150° C.

As described above, the pattern over the resolution limit of projection optical system 19 can be formed in the photoresist layer 2. For example, when metal wires are evaporated using this patterned photoresist layer 2 as a mask, a pattern of wires thus formed can surpass the resolution limit of projection optical system 19. The semiconductor devices include a plurality of transistors, and wires between transistors can be more shortened with a greater number of transistors per unit area, whereby the response time of semiconductor devices fabricated can be shortened. In order to increase the integration rate of transistors, the size of each transistor should be decreased. If this transistor is a field-effect transistor, the integration rate can be increased by narrowing the gap between the center of the gate electrode thereof and the center of the source electrode or drain electrode thereof. This distance between wires depends upon the wavelength ($\lambda$) of exposure light and the numerical aperture (NA) of projection optical system, and by forming these electrodes using the present method, the gap between the electrodes can be below the resolution limit of projection optical system 19, thereby improving the integration rate. The foregoing showed approximation of the characteristic curve of FIG. 5A using the two linear equations, but this curve can also be approximated by polynomials of degree five or more.

Figure 7:
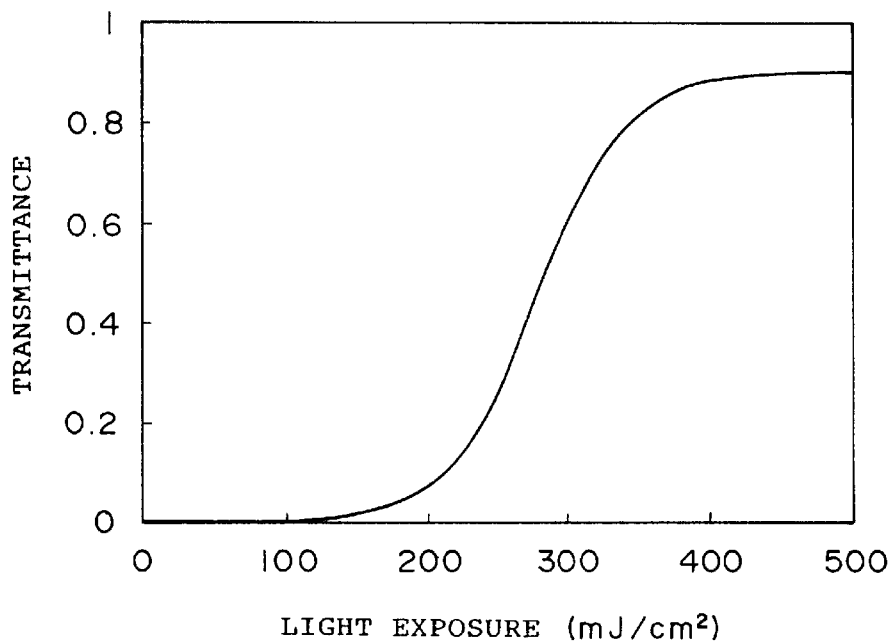
FIG. 7 is a graph to show the relationship between light exposure and transmittance.
Figure 8:
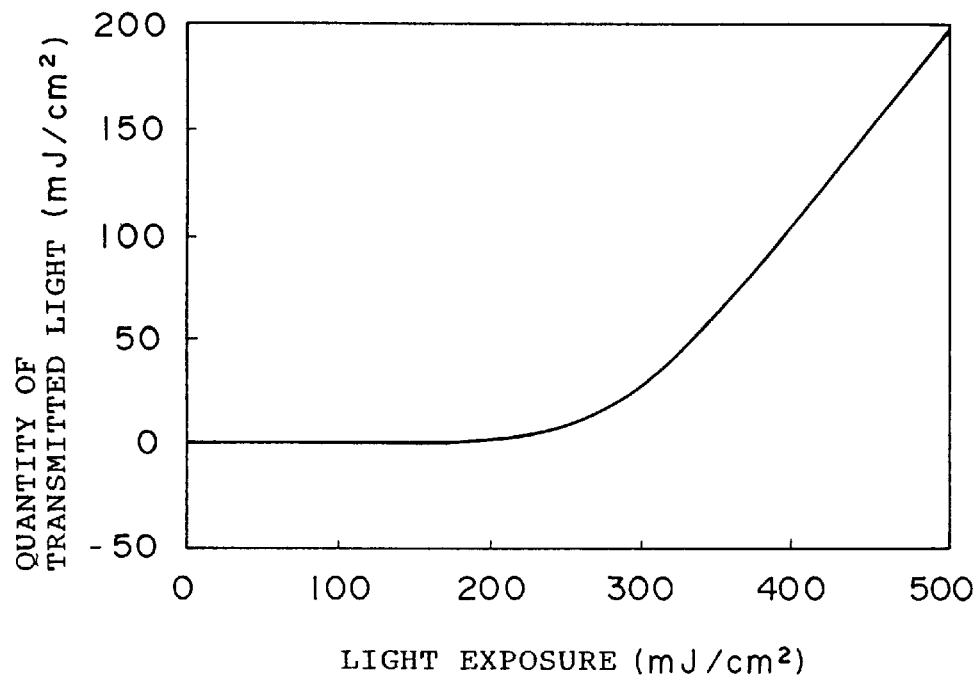
FIG. 8 is a graph to show the relationship between light exposure and quantity of transmitted light.
Figure 9:
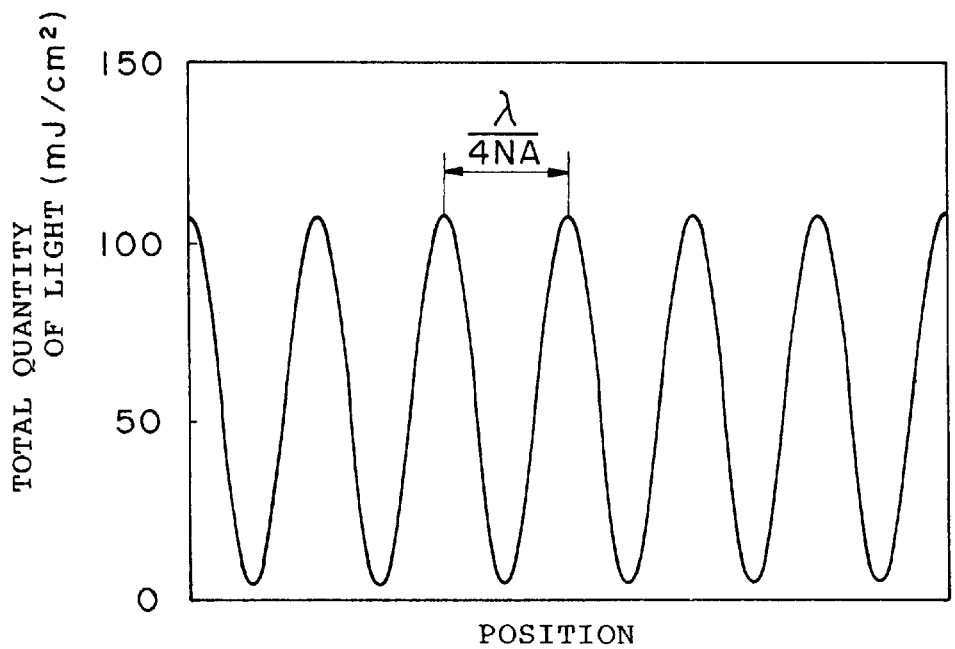
FIG. 9 is a graph to show the relationship between position and total light exposure.

Next explained is a method according to another embodiment. This method is different from the method of the above embodiment only in the thicknesses a of the CEM layers 3 and 3' and in the exposure period t. The thicknesses a of the CEM layers 3 and 3' both are 0.8 $\mu$m, and the exposure periods t of the first and second exposures both are four seconds. The relationship of transmittance t versus light exposure E (mJ/cm$^2$) of the CEM layers used in the present embodiment is shown in FIG. 7. The characteristic curve shown in FIG. 7 starts rising near the light exposure of 200 (mJ/cm$^2$) and saturates to a constant value near the light exposure of 350 (mJ/cm$^2$). Further, the relationship between light exposure E (mJ/cm$^2$) and quantity of transmitted light D (mJ/cm$^2$) is shown in FIG. 8. The characteristic curve shown in FIG. 8 starts rising near the light exposure of 250 (mJ/cm$^2$), and the quantity of transmitted light increases suddenly as the light exposure increases over the light exposure of 250 (mJ/cm$^2$). The relationship between position x and quantity of transmitted light D brought into the photoresist layer 2 (the latent image density distribution) obtained by this method is shown in FIG. 9. The contrast of this latent image pattern is 0.952.

The photoresist layer 2 may be one increasing the latent image densities in the photoresist layer 2 in proportion to the second power of intensity i of incident light (a second-order nonlinear photoresist). In this case, the relation of quantity of transmitted light D versus light exposure E shown in FIG. 6 becomes one obtained by squaring the ordinate thereof, so that a latent image pattern formed by the first exposure and second exposure becomes clearer. This can further enhance the contrast of the pattern finally obtained after multiple exposures (two or more exposures carried out for one photoresist). The contrast of the pattern by multiple exposures without using the CEM but with using only the second-order nonlinear photoresist is 0.33.

Next explained are an exposure apparatus for performing the two methods described above and a system using the exposure apparatus.

Figure 10:
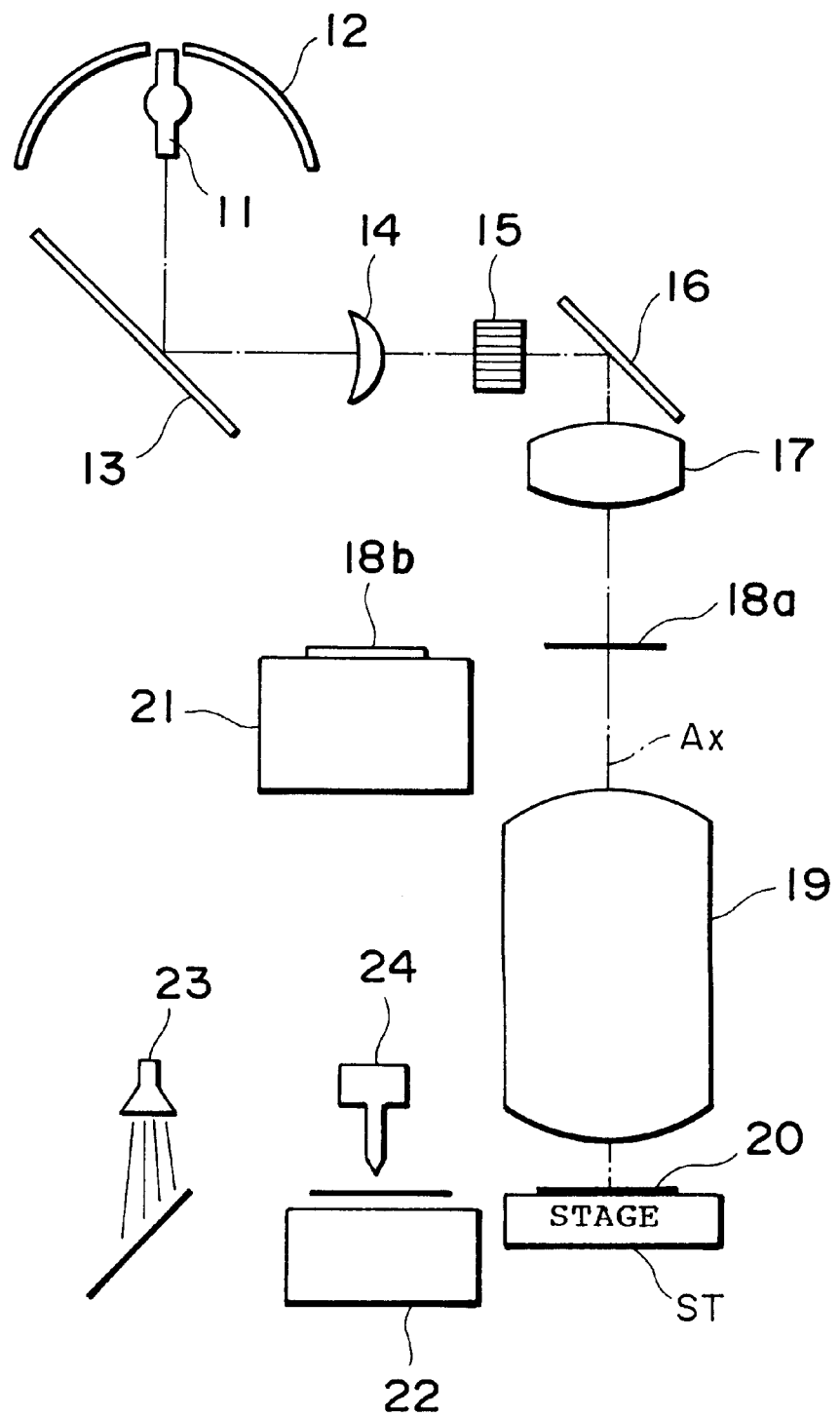
FIG. 10 is a drawing to show an exposure system.

FIG. 10 is a drawing to show a system provided with the exposure apparatus and peripheral devices. This exposure apparatus comprises a light source 11, an ellipsoidal reflector 12 for collecting the exposure light from the light source 11, a mirror 13, a collimator lens 14 to which light reflected by the mirror 13 is incident, a fly's-eye lens (fly's-eye integrator) 15 to which a parallel beam from the collimator lens 14 is incident, a mirror 16 to which light from the lens 15 is incident, and a main condenser lens 17 to which light from the mirror 16 is incident. Further, this apparatus comprises a projection optical system 19 to which light from the main condenser lens 17 is incident, and a stage ST on which an object 20 to be irradiated by the light from the projection optical system 19 is mounted. There is a space in which the reticle (photomask) 18a or 18b is selectively positioned, between the condenser lens 17 and the projection optical system 19. Accordingly, the exposure light from the condenser lens 17 is uniformly projected onto the photomask 18a or 18b. The pattern on the photomask 18a is projected onto the object 20 by the projection optical system 19. A reticle loader 21 changes over from the photomask 18a to the photomask 18b, and vice versa. A reticle loader 22 carries the object 20 after completion of the first exposure using the photomask 18a to a shower (peeling means) 23 for pouring pure water. After that, it carries the object 20 up to a CEM coater 24 for coating the object with the second CEM layer 3'. Then the wafer loader 22 carries the object 20 coated with the second CEM layer 3' back onto the stage ST. When the object 20 coated with the second CEM layer 3' is put on the stage ST, the reticle loader 21 changes over from the photomask 18a to the photomask 18b and the second exposure is started.

Instead of the arrangement of changeover between the first photomask 18a and the second photomask 18b by the reticle loader 21, the reticle loader 21 may be arranged to shift the first photomask by a half of the period P. Instead of moving the first photomask 18a, the stage ST may be arranged to be moved for every exposure. An effective alignment method between plural exposures is a latent-image alignment method for performing alignment as observing the latent image.

Figure 11:
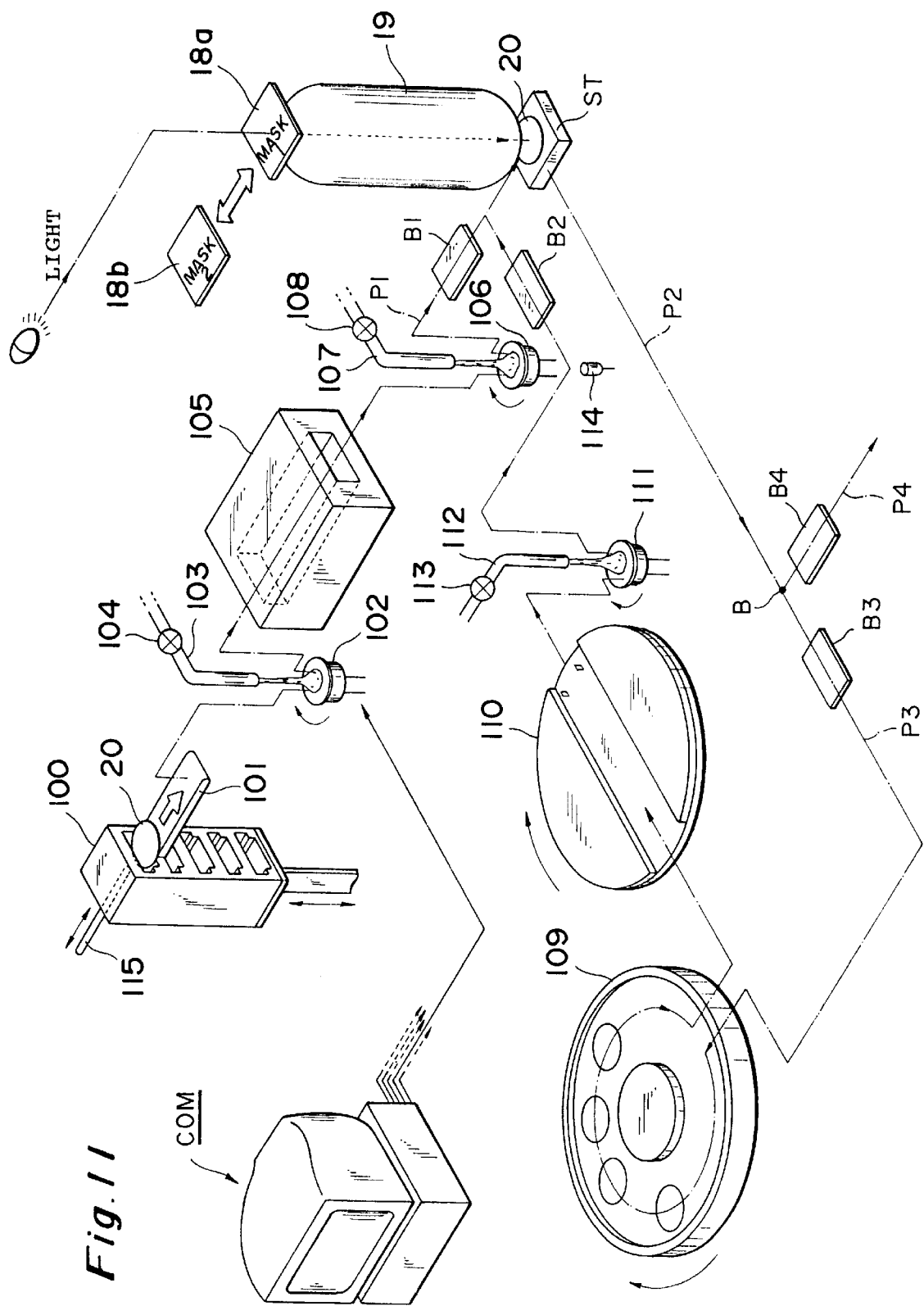
FIG. 11 is a drawing to show a pattern forming system.

FIG. 11 shows a pattern forming system using the exposure apparatus as described above. The operation of this system is controlled by a computer COM. This system is arranged to form a photoresist layer 2 on a wafer (substrate) 20 stored in a wafer cassette 100 and form the aforementioned latent image pattern in the photoresist layer 2. The wafer cassette 100 has a plurality of wafer storing sections, each of which stores a wafer 20. This wafer 20 is pushed out of the back of the wafer cassette 100 by a push rod 115 moving horizontally. A belt conveyor 101 is set on an extension line of the push rod 115. The cassette 100 is moved vertically by a driving mechanism not shown. The vertical movement of this cassette 100, the horizontal movement of the push rod 115, and the conveying operation of the conveyor 101 are controlled by the computer COM. Namely, the computer COM stops the cassette 100 while the push rod 115 pushes the wafer 20; the computer moves the cassette vertically while the push rod 115 is not pushing the wafer 20. Therefore, the movement of cassette 100 is synchronized with the movement of the push rod 115, so that the wafers 20 stored in the cassette 100 will be transferred one after another onto the conveyor 101. The wafer 20 on the conveyor 101 is transferred onto a spinner 102 by an unrepresented mechanism. The spinner 102 is controlled by the computer COM so as to rotate when the wafer 20 is set thereon. A nozzle 103 for delivering a photoresist material is set above the spinner 102, and an amount of the photoresist material delivered from the nozzle 103 is adjusted by a valve 104. After the wafer 20 is set on the spinner 102, the computer COM controls the valve 104 so as to supply a desired amount of photoresist material from the nozzle 103 onto the wafer 20. After the desired amount of photoresist material is supplied onto the wafer 20, the computer COM rotates the spinner 102 for a predetermined period of time, and thereafter stops rotation of the spinner 102.

Then the computer COM controls an unrepresented mechanism to carry the wafer 20 from the spinner 102 to a baking furnace 105. The temperature inside the baking furnace 105 is kept at 80° C. The wafer 20 is let to pass inside the baking furnace 105 and thereafter is carried onto a spinner 106 by an unrepresented mechanism.

A nozzle 107 for delivering the CEM is disposed above the spinner 106 and a valve 108 adjusts an amount of the CEM delivered from the nozzle 107. After the wafer 20 is placed on the spinner 106, the computer COM controls the valve 108 to supply a desired amount of CEM from the nozzle 107 onto the photoresist layer 2 on the wafer 20. After the desired amount of CEM is supplied onto the wafer 20, the computer COM rotates the spinner 106 for a predetermined period of time and thereafter stops rotation of the spinner 106.

When the CEM containing nitrone is used, a binder resin is applied onto the photoresist layer before application of the CEM, though not shown in the drawing.

After that, the computer COM controls a belt conveyor B1 and the wafer loader 22 shown in FIG. 10 to convey the wafer 20 from the spinner 106 onto the stage ST. A path through which the wafer 20 is conveyed from the spinner 106 onto the stage ST is defined as a first path P1. When the wafer 20 is set on the stage ST, the computer COM controls the reticle loader 21 of FIG. 10 to convey the first photomask 18a from a reticle library not shown to above the projection optical system 19. After that, the computer COM lets the light source 11 emit the exposure light to effect the first exposure. After completion of the first exposure, the computer COM controls an unrepresented mechanism and a conveyor B3 to carry the wafer 20 from the stage ST to a CEM peeling device 109. The CEM peeling device 109 is a water bath and the CEM layer 3 used for projection of the first pattern is removed from the object 20 by immersing the object 20 in this water bath 109. Subsequently, the wafer 20 is carried to a drier 110. The drier 110 is a device for removing water attached to the wafer disposed thereon by utilizing the centrifugal force and is controlled by the computer COM. After the wafer 20 is set in the drier 110, the drier 110 rotates for a predetermined period of time to dry the wafer 20.

Then the wafer 20 is carried onto a spinner 111 by an unrepresented mechanism. A nozzle 112 for delivering the CEM is disposed above the spinner 111, and a valve 113 adjusts an amount of the CEM delivered from the nozzle 112. After the wafer 20 is set on the spinner 111, the computer COM controls the valve 113 to supply a desired amount of CEM from the nozzle 112 onto the photoresist layer 2 on the wafer 20. After the desired amount of CEM is supplied onto the wafer 20, the computer COM rotates the spinner 111 for a predetermined period of time and thereafter stops rotation of the spinner 111, thus forming the second CEM layer 3' on the photoresist layer 2. After the second CEM layer 3' is formed on the photoresist layer 2, the object 20 is conveyed again onto the stage ST by a belt conveyor B2 controlled by the computer COM. A path running from the stage ST up to a point B before the belt conveyor B3 is defined as a second path P2, and a path running from the point B via the belt conveyors B3 and B2 up to the stage ST as a third path P3. A sensor 114 detects pass of the wafer 20 on the path P3 between the spinner 111 and the conveyor B2. When the sensor 114 detects pass of the wafer 20, the computer COM stops conveyance of the wafer 20 on the first path P1.

When the wafer 20 with the second CEM layer 3' formed thereon is disposed on the stage ST, the computer COM controls the reticle loader 21 of FIG. 10 to change over from the first photomask 18a to the second photomask 18b. After that, the computer COM lets the light source 11 emit the exposure light to effect the second exposure. These two exposures result in forming a latent image pattern $C_{TOTAL}$ in the photoresist layer 2. After completion of the second exposure, the computer COM controls an unrepresented mechanism to convey the wafer 20 through the second path P2 onto a belt conveyor B4. The conveyor B4 conveys the wafer 20 to CEM peeling device and photoresist peeling device not shown in order. Thus, through these steps, a fine pattern over the resolution limit of projection optical system 19 is formed on the wafer 20.

Figure 12:
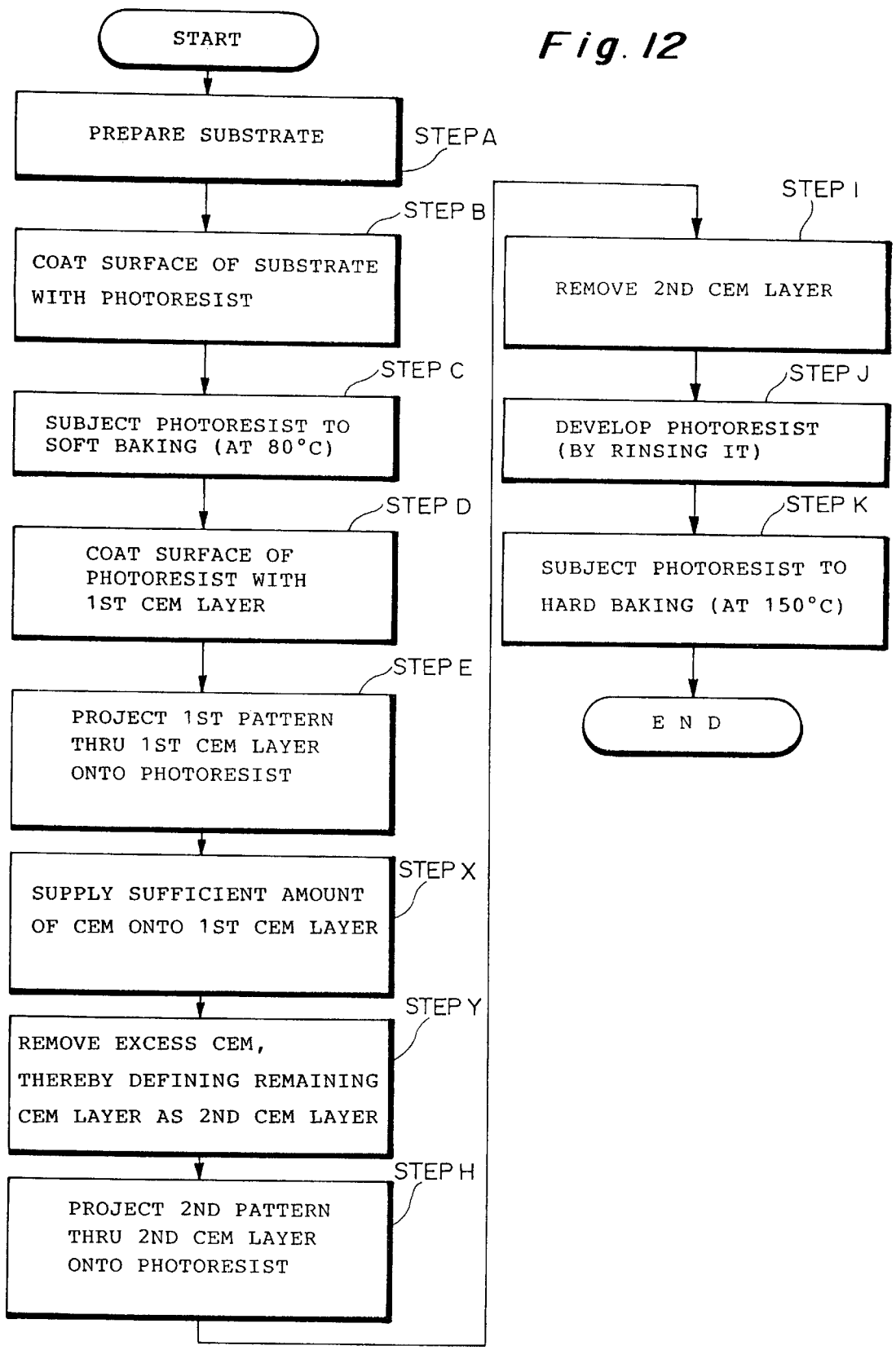
FIG. 12 is a flowchart for explaining a method according to another embodiment.

Next explained is another embodiment. The present embodiment is arranged to simultaneously perform the step of removing the first CEM layer and the step of forming the second CEM layer described above. FIG. 12 is a flowchart for explaining a method according to the present embodiment. Steps A–E and steps H–K are the same as those explained with FIG. 1. At step X the object 20 after the first exposure is disposed on a spinner not shown and a sufficient amount of CEM is supplied from a nozzle not shown onto the first CEM layer 3. Next, at step Y this spinner is rotated to remove an excess amount of CEM. Namely, a part of the first CEM layer 3 is replaced by a newly supplied CEM, thereby forming the second CEM layer 3' on the photoresist layer 2.

The CEM used in the present embodiment will be described. The CEM used in the present embodiment is expressed by the parameters $A=11.120/\mu m$, $B=0.041/\mu m$, and $C=0.022$ $cm^2/mJ$. The thicknesses a of the CEM layers 3 and 3' both are 0.62 $\mu m$.

Figure 13:
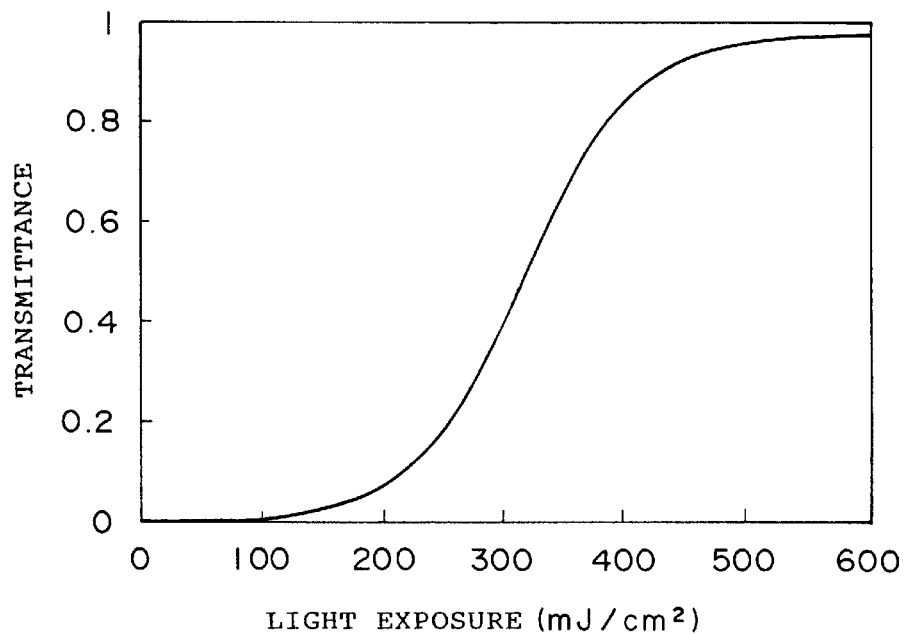
FIG. 13 is a graph to show the relationship between light exposure and transmittance.

FIG. 13 is a graph to show the relationship between light exposure E ($mJ/cm^2$) and transmittance T of CEM layer when the above CEM layer is used. According to this graph, the transmittance curve starts rising from near the light exposure 200 $mJ/cm^2$ and saturates to a constant value near the light exposure 500 $mJ/cm^2$.

Figure 14:
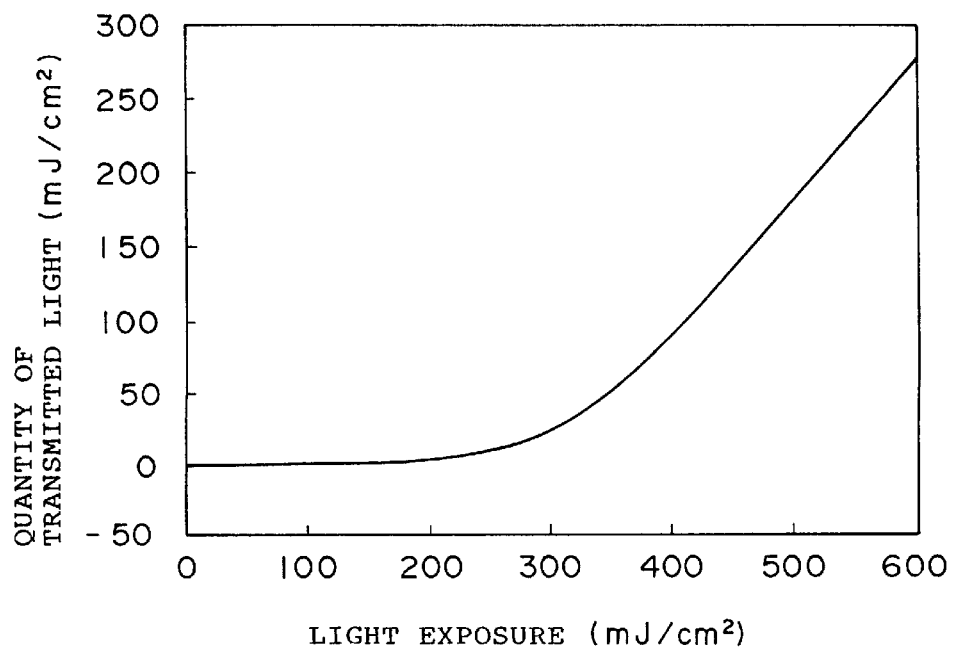
FIG. 14 is a graph to show the relationship between light exposure and quantity of transmitted light.

FIG. 14 is a graph to show the relationship between light exposure E ($mJ/cm^2$) and quantity of transmitted light D ($mJ/cm^2$) when this CEM layer is used. Referring to FIG. 14, the exposure light rarely reaches the surface of the photoresist layer 2 before the light exposure E reaches the threshold $E_0$. After the light exposure E exceeds the threshold $E_0$, the light exposure to the surface of the photoresist layer 2 increases suddenly. This characteristic curve can also be approximated by polynomials of degree five or more.

In the present embodiment the numerical aperture NA of projection optical system 19 is 0.6, the wavelength $\lambda$ 365 nm, and the period, $P=\lambda/2NA$, is 304 nm. In the first exposure the light of the intensity represented by Eq. 4 is projected onto the CEM layer 3. In the present embodiment, $I_0=37.5$ $mW/cm^2$ and $I_1=62.5$ $mW/cm^2$ in Eq. 4. The exposure period t in the first exposure is 4 seconds.

Figure 15A:
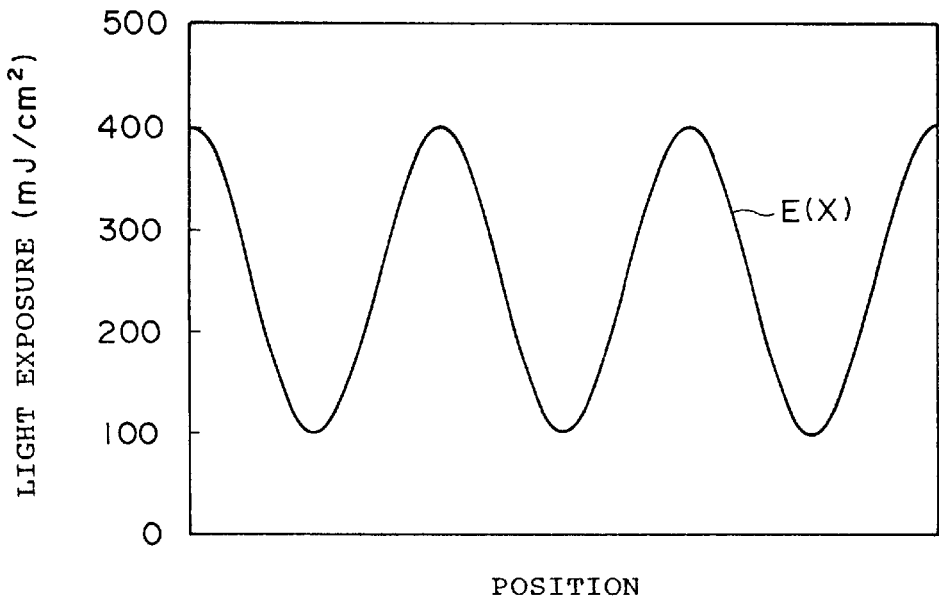
FIG. 15A is a graph to show the relationship between position and light exposure.

FIG. 15A is a graph to show the relationship between position x on the CEM layer 3 and light exposure E(x) ($mJ/cm^2$).

Figure 15B:
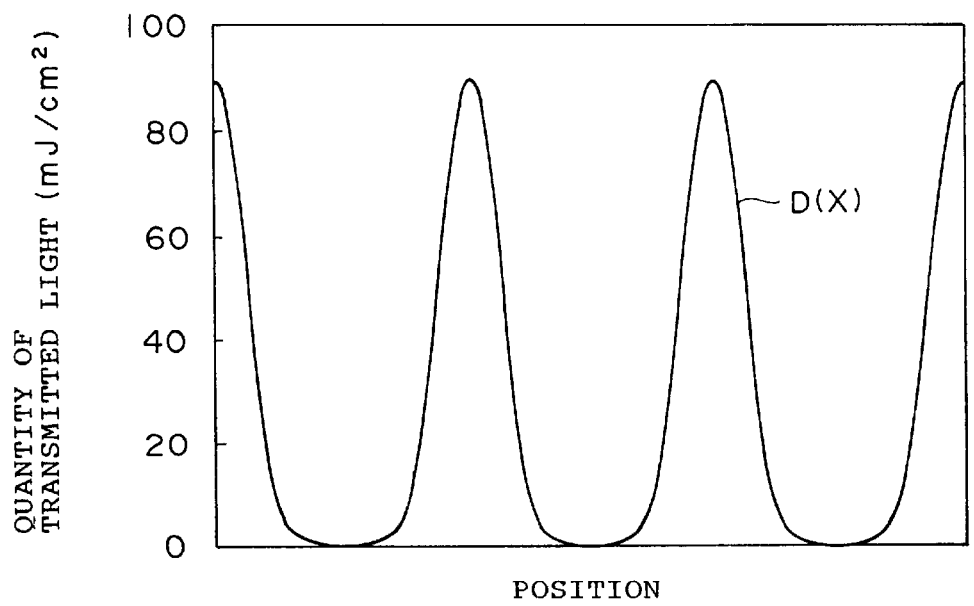
FIG. 15B is a graph to show the relationship between position and quantity of transmitted light.

FIG. 15B is a graph to show the relationship between position x on the photoresist layer 2 and quantity of transmitted light D(x) impinging on the photoresist layer 2 when the pattern of light exposure E(x) shown in FIG. 15S is projected onto the CEM layer 3. The transmitted light quantity distribution D(x) shown in FIG. 15B is calculated from FIG. 14 and FIG. 15A. Referring to FIG. 15B, the bottom parts of the light exposure distribution shown in FIG. 15A become flatter and the top portions of the light exposure distribution become sharper. This first exposure forms a latent image density distribution proportional to the transmitted light quantity D shown in FIG. 15B, in the photoresist layer 2.

In the second exposure, the pattern of the intensity represented by Eq. 14 is projected onto the CEM layer 3'. Namely, this second pattern is shifted by the half period relative to the first pattern. Also in this exposure, $I_0=37.5$ $mW/cm^2$ and $I_1=62.5$ $mW/cm^2$. Further, the exposure period t in the second exposure is also 4 seconds.

Figure 16A:
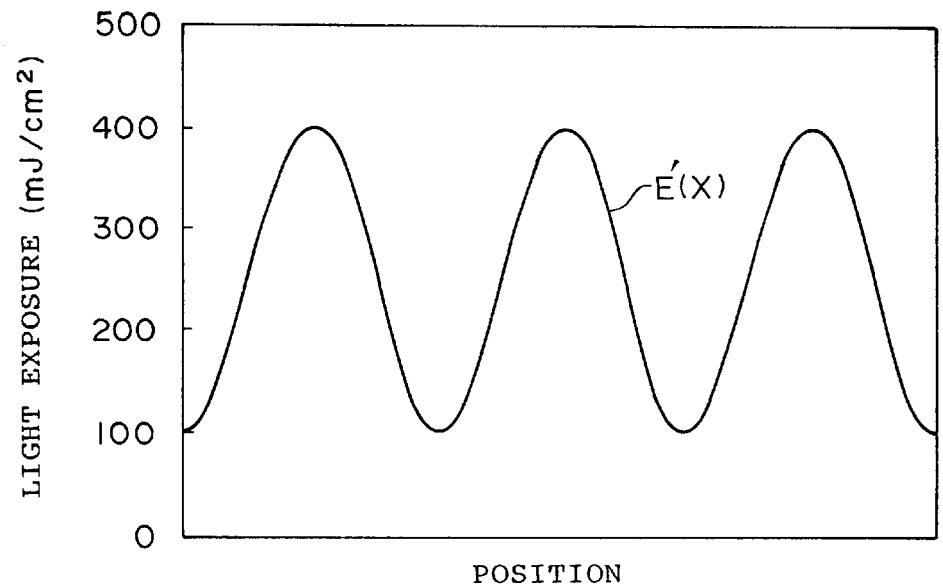
FIG. 16A is a graph to show the relationship between position and light exposure.

FIG. 16A is a graph to show the relationship between position x on the CEM layer 3' and light exposure E'(x) ($mJ/cm^2$). The light exposure distribution E'(x) by the second pattern is shifted by the half period relative to the light exposure distribution E(x) by the first pattern.

Figure 16B:
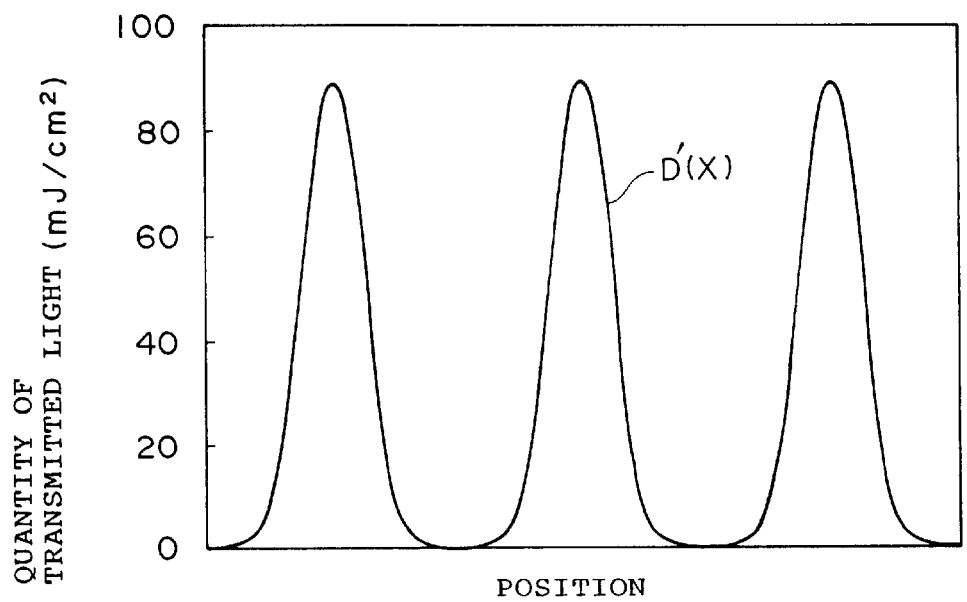
FIG. 16B is a graph to show the relationship between position and quantity of transmitted light.

FIG. 16B is a graph to show the relationship between position x on the photoresist layer 2 and quantity of transmitted light D'(x) impinging on the photoresist layer 2 when the pattern of light exposure E shown in FIG. 16A is projected onto the CEM layer 3'. The transmitted light quantity distribution D'(x) shown in FIG. 16B is calculated from FIG. 14 and FIG. 16A. Referring to FIG. 16B, the bottom portions of the light exposure distribution shown in FIG. 16A become flatter and the top portions of the light exposure distribution become sharper. This second exposure forms the latent image density distribution proportional to the transmitted light quantity D shown in FIG. 16B, in the photoresist layer 2.

Figure 17:
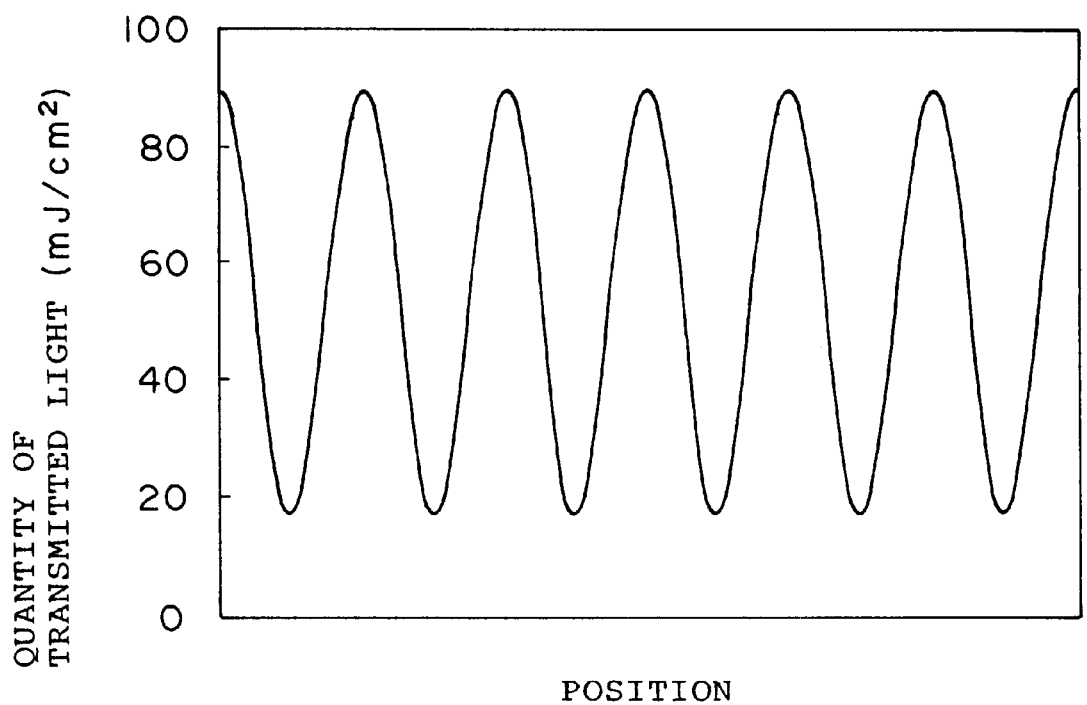
FIG. 17 is a graph to show the relationship between position and total light exposure.

FIG. 17 is a graph to show the relationship between position on the photoresist layer 2 and the latent image pattern $C_{TOTAL}$ (transmitted light quantity D) finally formed in the photoresist layer 2 by the first and second exposures. Since the latent image density distribution by the first exposure is already formed in the photoresist layer 2, the period of the latent image pattern $C_{TOTAL}$ finally formed in the photoresist layer 2 by the first and second exposures is a half of the period P of the first and second patterns. The contrast of this pattern is 0.65.

Figure 18:
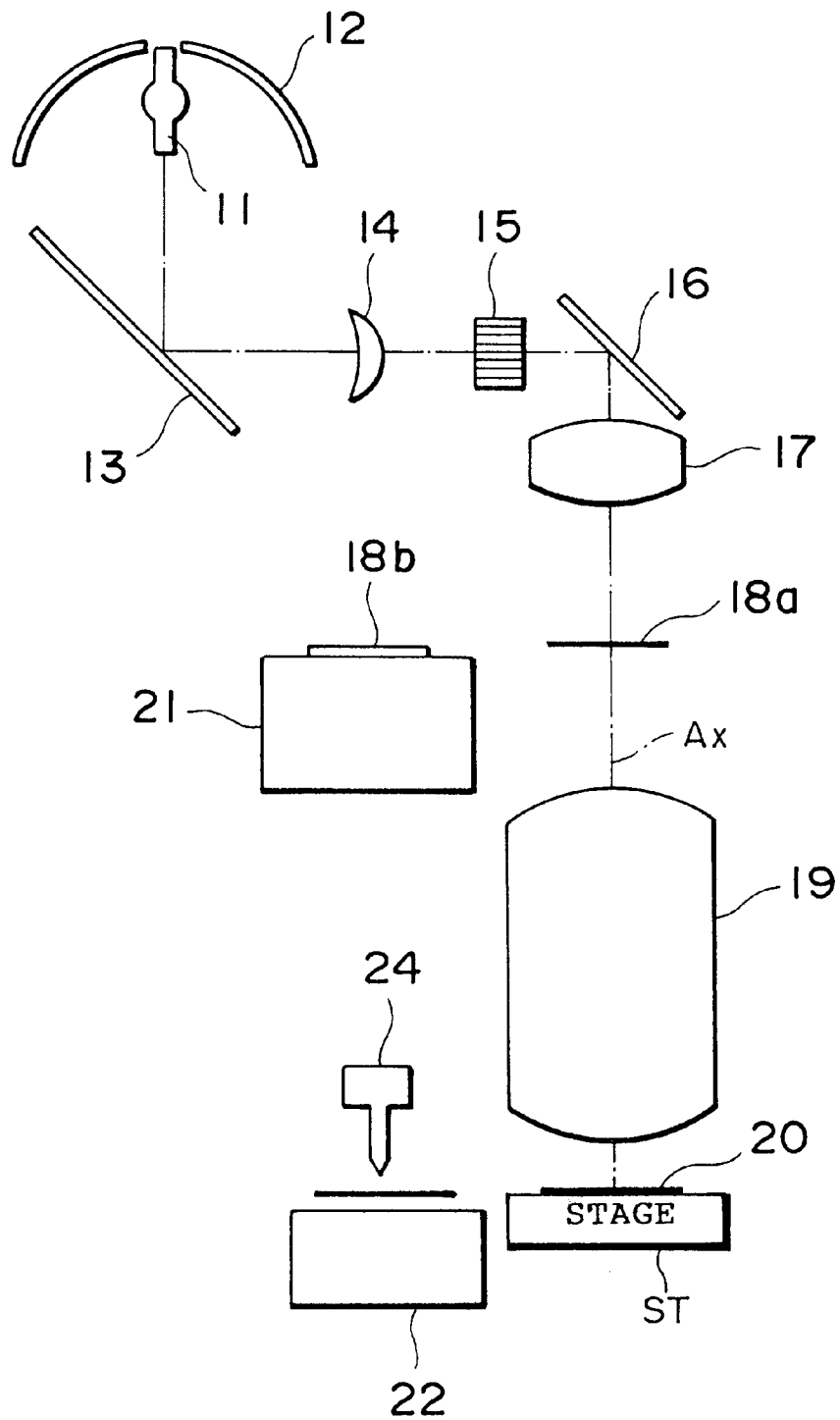
FIG. 18 is a drawing to show an exposure system.

FIG. 18 is a system provided with an exposure apparatus and peripheral devices for performing exposure. The exposure apparatus is the same as shown in FIG. 10 and the description thereof is omitted herein. This system does not need the peeling device for peeling off the first CEM layer 3 shown in FIG. 10.

After completion of the first exposure with the photomask 18a, the wafer loader 22 of the present system carries the object 20 to the CEM coater 24 for coating the object with the second CEM layer 3'. In this step, the first CEM layer 3 is replaced by the second CEM layer 3'. After this, the wafer loader 22 carries the object 20 coated with the second CEM layer 3' onto the stage ST. When the object 20 coated with the second CEM layer 3' is transferred onto the stage ST, the reticle loader 21 changes over from the photomask 18a to the photomask 18b and then the second exposure is carried out.

The present system may also be arranged to shift the first photomask by a half of the period P by the reticle loader 21 instead of changing over from the first photomask 18a to the second photomask 18b. Alternatively, the stage ST may be moved for every exposure instead of moving the first photomask 18a.

What is claimed is:

1. An exposure method comprising the steps of:

forming a photoresist layer on a substrate;

forming a first contrast enhancement material layer on said photoresist layer;

projecting a first pattern through said first contrast enhancement material layer onto said photoresist layer to form a first latent image pattern in said photoresist layer;

removing said first contrast enhancement material layer from said photoresist layer while leaving said photoresist layer on said substrate;

forming a second contrast enhancement material layer on said photoresist layer, in which said first latent image pattern has been formed; and projecting a second pattern through said second contrast enhancement material layer onto said photoresist layer.

2. The method according to claim 1, wherein a thickness of said first contrast enhancement material layer is 0.4 $\mu m$ or more.

3. The method according to claim 1, wherein a transmittance of said first contrast enhancement material layer is nonlinear against light exposure.

4. The method according to claim 1, wherein a transmittance of said first contrast enhancement material layer is substantially constant in the range where light exposure is not more than a predetermined range between 200–400 mJ/cm$^2$, but the transmittance of said first contrast enhancement material layer increases in the range where the light exposure is greater than said predetermined range.

5. The method according to claim 1, wherein said first contrast enhancement material comprises nitrone.

6. The method according to claim 1, wherein said second contrast enhancement material comprises a diazonium salt.

7. The method according to claim 1, wherein said first contrast enhancement material layer removing step and said second contrast enhancement material layer forming step are simultaneously achieved by applying onto said first contrast enhancement material layer a quantity of a new contrast enhancement material sufficient to replace part of the first contrast enhancement material layer to form said second contrast enhancement material layer.

8. The method according to claim 1, wherein said first pattern includes a first line and a second line being spaced apart from each other, wherein said second pattern includes a third line, and wherein said third line is located between said first and second lines on said photoresist, the interval between said third line and either of said first and second lines being beyond the resolution limit of a projection optical system performing said projecting steps.

\* \* \* \* \*